United States Patent
Yim et al.

(10) Patent No.: US 12,170,322 B2
(45) Date of Patent: Dec. 17, 2024

(54) DEVICES INCLUDING STACKED NANOSHEET TRANSISTORS

(71) Applicant: Samsung Electronics Co., Ltd., Suwon-si (KR)

(72) Inventors: Jeonghyuk Yim, Halfmoon, NY (US); Byounghak Hong, Latham, NY (US); Jungsu Kim, Hwaseong-si (KR); Kang-ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 630 days.

(21) Appl. No.: 17/504,720

(22) Filed: Oct. 19, 2021

(65) Prior Publication Data

US 2022/0367658 A1 Nov. 17, 2022

Related U.S. Application Data

(63) Continuation-in-part of application No. 17/380,999, filed on Jul. 20, 2021, now Pat. No. 11,843,001.

(60) Provisional application No. 63/232,280, filed on Aug. 12, 2021, provisional application No. 63/188,501, filed on May 14, 2021.

(51) Int. Cl.
*H01L 29/423* (2006.01)
*H01L 29/06* (2006.01)
*H01L 29/66* (2006.01)
*H01L 29/786* (2006.01)

(52) U.S. Cl.
CPC .... *H01L 29/42392* (2013.01); *H01L 29/0665* (2013.01); *H01L 29/66742* (2013.01); *H01L 29/786* (2013.01)

(58) Field of Classification Search
CPC .......... H01L 29/66787; H01L 21/8221; H01L 27/0688; H01L 29/0673
See application file for complete search history.

(56) References Cited

U.S. PATENT DOCUMENTS

| | | | |
|---|---|---|---|
| 9,929,214 B2 | 3/2018 | Apodaca et al. | |
| 10,297,664 B2 | 5/2019 | Xie | |
| 10,347,719 B2 | 7/2019 | Cheng et al. | |
| 10,658,481 B1 | 5/2020 | Zhang et al. | |
| 10,741,456 B2 | 8/2020 | Cheng et al. | |
| 10,784,171 B2 | 9/2020 | Frougier et al. | |
| 10,879,308 B1 | 12/2020 | Ando et al. | |
| 10,991,711 B2 | 4/2021 | Reznicek et al. | |
| 2010/0176460 A1 | 7/2010 | Goto | |
| 2019/0172751 A1* | 6/2019 | Smith | H01L 27/0924 |
| 2019/0312104 A1 | 10/2019 | Cheng et al. | |

(Continued)

OTHER PUBLICATIONS

Extended European Search Report Corresponding to European Application No. 22173177.1 (13 pages) (Sep. 15, 2022).

*Primary Examiner* — John A Bodnar
(74) *Attorney, Agent, or Firm* — Myers Bigel, P.A.

(57) ABSTRACT

Nanosheet transistor devices are provided. A nanosheet transistor device includes a transistor stack that includes a lower nanosheet transistor having a first nanosheet width and a lower gate width. The transistor stack also includes an upper nanosheet transistor that is on the lower nanosheet transistor and that has a second nanosheet width and an upper gate width that are different from the first nanosheet width and the lower gate width, respectively. Related methods of forming a nanosheet transistor device are also provided.

20 Claims, 31 Drawing Sheets

(56) References Cited

U.S. PATENT DOCUMENTS

| | | |
|---|---|---|
| 2019/0393214 A1 | 12/2019 | Lilak et al. |
| 2020/0006356 A1 | 1/2020 | Ando et al. |
| 2020/0035569 A1 | 1/2020 | Frougier et al. |
| 2020/0075574 A1 | 3/2020 | Smith et al. |
| 2020/0098756 A1 | 3/2020 | Lilak et al. |
| 2020/0098859 A1 | 3/2020 | Reboh et al. |
| 2020/0105751 A1 | 4/2020 | Dewey et al. |
| 2020/0105891 A1 | 4/2020 | Lilak et al. |
| 2020/0135735 A1 | 4/2020 | Sengupta et al. |
| 2020/0203341 A1 | 6/2020 | Barraud et al. |
| 2020/0294866 A1 | 9/2020 | Cheng et al. |
| 2020/0365464 A1 | 11/2020 | Sreenivasan et al. |
| 2021/0005604 A1 | 1/2021 | Ge et al. |
| 2021/0013107 A1 | 1/2021 | Gardner et al. |
| 2021/0036122 A1 | 2/2021 | Wong et al. |
| 2022/0013521 A1 | 1/2022 | Zhang et al. |
| 2022/0109046 A1 | 4/2022 | Hong et al. |

\* cited by examiner

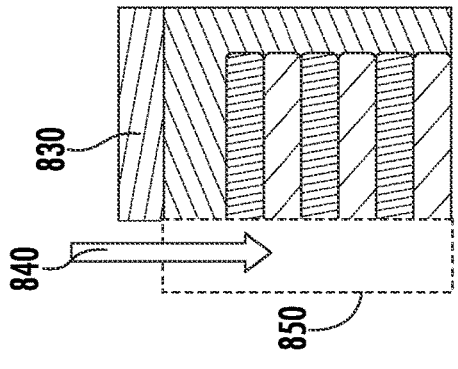
FIG. 8A
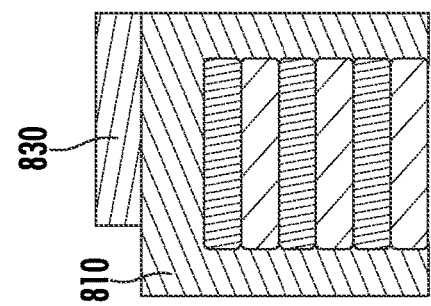
FIG. 8B
FIG. 8C
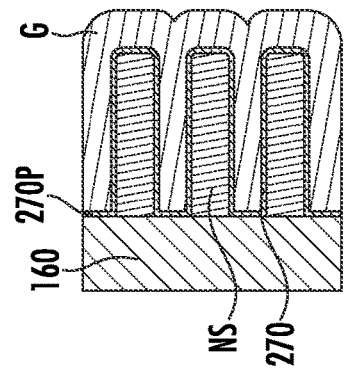
FIG. 8D
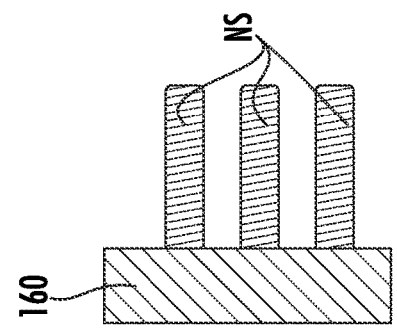
FIG. 8E
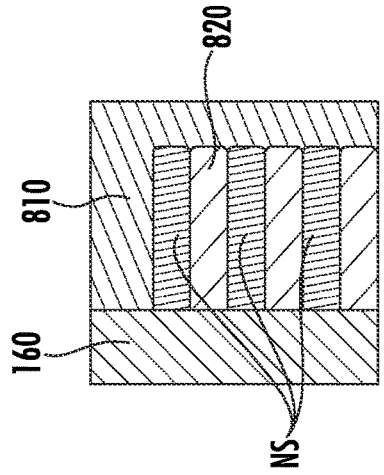
FIG. 8F

DEVICES INCLUDING STACKED NANOSHEET TRANSISTORS

CLAIM OF PRIORITY

The present application is a continuation-in-part of U.S. patent application Ser. No. 17/380,999, filed on Jul. 20, 2021, which itself claims the benefit of U.S. Provisional Patent Application Ser. No. 63/188,501, filed on May 14, 2021, entitled Devices Including Trigate Stepped Nanosheet, the disclosure of each of which is hereby incorporated herein in its entirety by reference. The present application also claims the benefit of U.S. Provisional Patent Application Ser. No. 63/232,280, filed on Aug. 12, 2021, entitled Threshold Voltage Modulation Methods for a 3D Stacked Tri-Gate Device, the disclosure of which is hereby incorporated herein in its entirety by reference.

FIELD

The present disclosure generally relates to the field of semiconductor devices and, more particularly, to nanosheet transistor devices.

BACKGROUND

The density of transistors in electronic devices has continued to increase. Though three-dimensional transistor structures can help to increase transistor density, they may experience electrical vulnerabilities, such as parasitic capacitance. For example, parasitic capacitance between a contact metal and a gate metal of a three-dimensional transistor structure can reduce device performance.

SUMMARY

A nanosheet transistor device, according to some embodiments herein, may include a lower nanosheet transistor having a first nanosheet width and an upper tri-gate nanosheet transistor on an upper surface of the lower nanosheet transistor. The upper tri-gate nanosheet transistor may have a second nanosheet width that is narrower than the first nanosheet width. Moreover, the nanosheet transistor device may include an insulation region that includes oxygen and is on the upper surface of the lower nanosheet transistor and a sidewall of the upper tri-gate nanosheet transistor.

A nanosheet transistor device, according to some embodiments, may include a transistor stack. The transistor stack may include a lower nanosheet transistor having a first nanosheet width and a lower gate width. The lower nanosheet transistor may include a plurality of lower nanosheets. Moreover, the transistor stack may include an upper nanosheet transistor on the lower nanosheet transistor. The upper nanosheet transistor may have a second nanosheet width and an upper gate width that are different from the first nanosheet width and the lower gate width, respectively. The upper nanosheet transistor may include a plurality of upper nanosheets. The transistor stack may include an insulation region having a sidewall that contacts at least one of the plurality of lower nanosheets and is on a sidewall of a gate of the lower nanosheet transistor, or contacts at least one of the plurality of upper nanosheets and is on a sidewall of a gate of the upper nanosheet transistor. The lower nanosheet transistor or the upper nanosheet transistor may include a gate insulation layer having an end portion that is on the sidewall of the insulation region.

A method of forming a nanosheet transistor device, according to some embodiments, may include forming a preliminary transistor stack including a plurality of lower nanosheets and a plurality of upper nanosheets on the plurality of lower nanosheets. The method may include forming a recess in the preliminary transistor stack by removing a first portion of the plurality of lower nanosheets or a first portion of the plurality of upper nanosheets. The method may include forming an insulation region in the recess. Moreover, the insulation region may contact a second portion of the plurality of lower nanosheets that remains after removing the first portion of the plurality of lower nanosheets, or a second portion of the plurality of upper nanosheets that remains after removing the first portion of the plurality of upper nanosheets.

BRIEF DESCRIPTION OF THE DRAWINGS

FIGS. 8A-8F are cross-sectional views illustrating operations of forming the insulation region of FIG. 1C before forming a metal gate material.

DETAILED DESCRIPTION

Pursuant to embodiments of the present invention, nanosheet transistor devices comprising a transistor stack are provided. A transistor stack includes a lower transistor and an upper transistor that vertically overlaps the lower transistor and that may share a gate electrode with the lower transistor. Though stepped nanosheet ("sNS") structures, which have different upper and lower nanosheet widths, have been proposed, a gate metal of an sNS structure may have parasitic capacitance with an adjacent contact metal. Specifically, the capacitance may increase with increased width of the gate on the stepped portion of the sNS structure. According to embodiments of the present invention, however, parasitic capacitance between an sNS gate and a source/drain contact can be reduced by removing a portion of the gate electrode material that is closest to the source/drain contact.

Example embodiments of the present invention will be described in greater detail with reference to the attached figures.

Figure 1A:
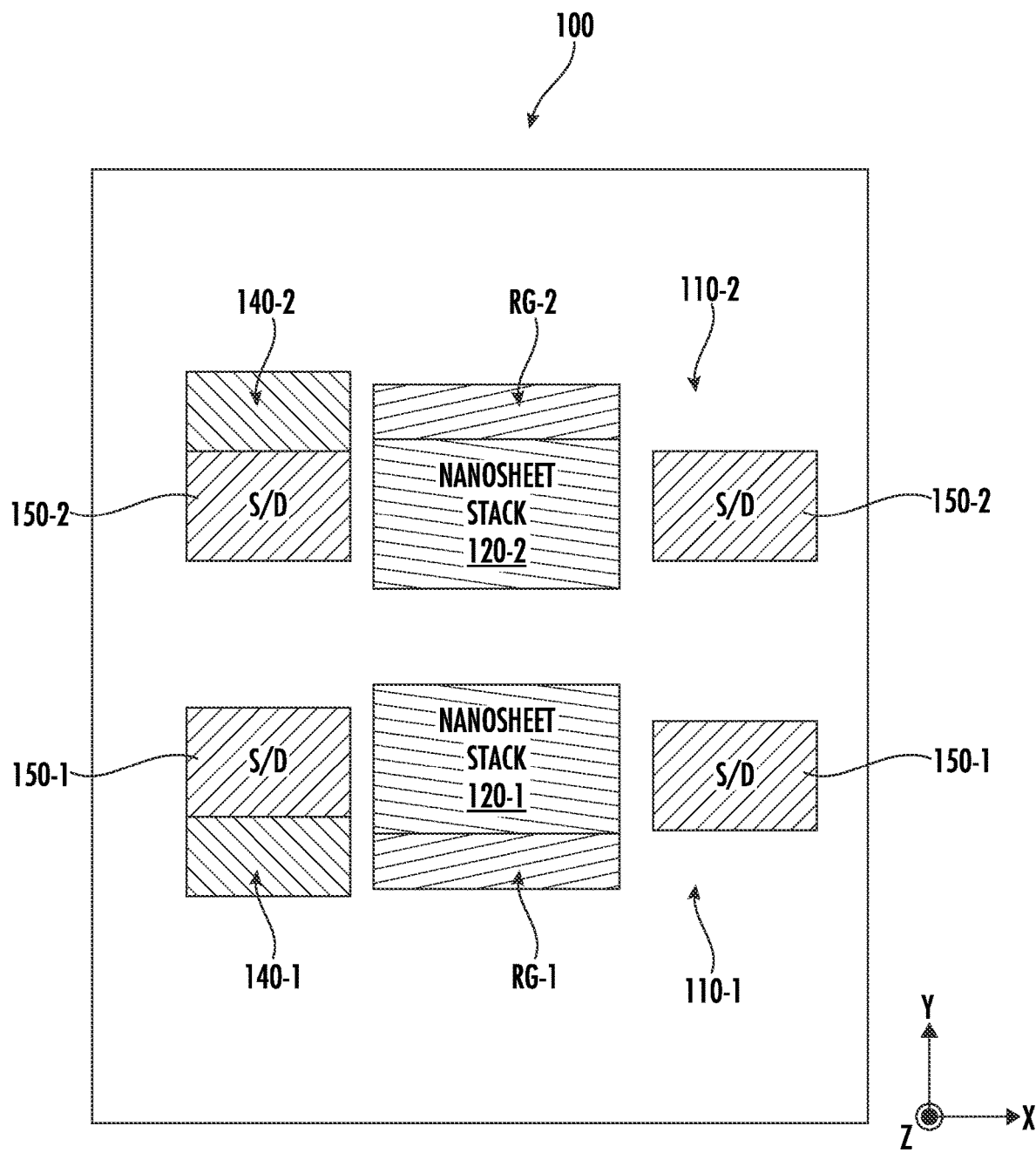
FIG. 1A is a plan view of a nanosheet transistor device according to some embodiments of the present invention.

FIG. 1A is a plan view of a nanosheet transistor device 100 according to some embodiments of the present invention. The device 100 includes first and second transistor stacks 110-1, 110-2. For simplicity of illustration, only two transistor stacks 110 are shown in FIG. 1A. In some embodiments, however, the device 100 may include three, four, or more transistor stacks 110. For example, the two transistor stacks 110-1, 110-2 may be a pair of transistor stacks 110 that are closer to each other than to any other transistor stack 110 in the device 100.

The first transistor stack 110-1 includes a first nanosheet stack 120-1 that is between a pair of source/drain regions 150-1 in a first horizontal direction X. The first nanosheet stack 120-1 includes nanosheets NS (FIG. 1B) and a gate G (FIG. 1B) that is on the nanosheets NS. Though the nanosheets NS may contact the source/drain regions 150-1, the gate G may be spaced apart from the source drain regions 150-1 in the direction X.

A source/drain contact 140-1, which may comprise metal, is adjacent one of the source/drain regions 150-1 in a second horizontal direction Y, which may be perpendicular to the direction X. For example, the source/drain contact 140-1 may be a drain contact. For simplicity of illustration, only one source/drain contact 140-1 is shown in FIG. 1A. In some embodiments, however, each source/drain region 150-1 may have a respective source/drain contact 140-1 adjacent thereto in the second horizontal direction Y. Accordingly, a pair of source/drain contacts 140-1 can be on opposite sides of the first nanosheet stack 120-1.

To reduce parasitic capacitance with the source/drain contact(s) 140-1, a region RG-1 of the nanosheet stack 120-1 that is adjacent (e.g., aligned/overlapping in the direction X with) the source/drain contact(s) 140-1 may be free of a gate electrode material (e.g., metal). The region RG-1 may also reduce parasitic capacitance with both source/drain regions 150-1. Likewise, a second nanosheet stack 120-2 of the second transistor stack 110-2 is between a pair of source/drain regions 150-2 and has a gate-free region RG-2 that is adjacent a source/drain contact 140-2.

For simplicity of illustration, only one source/drain contact 140-2 is shown in FIG. 1A. In some embodiments, however, each source/drain region 150-2 may have a respective source/drain contact 140-2 adjacent thereto in the second horizontal direction Y. Accordingly, a pair of source/drain contacts 140-2 can be on opposite sides of the second nanosheet stack 120-2.

Figure 1B:
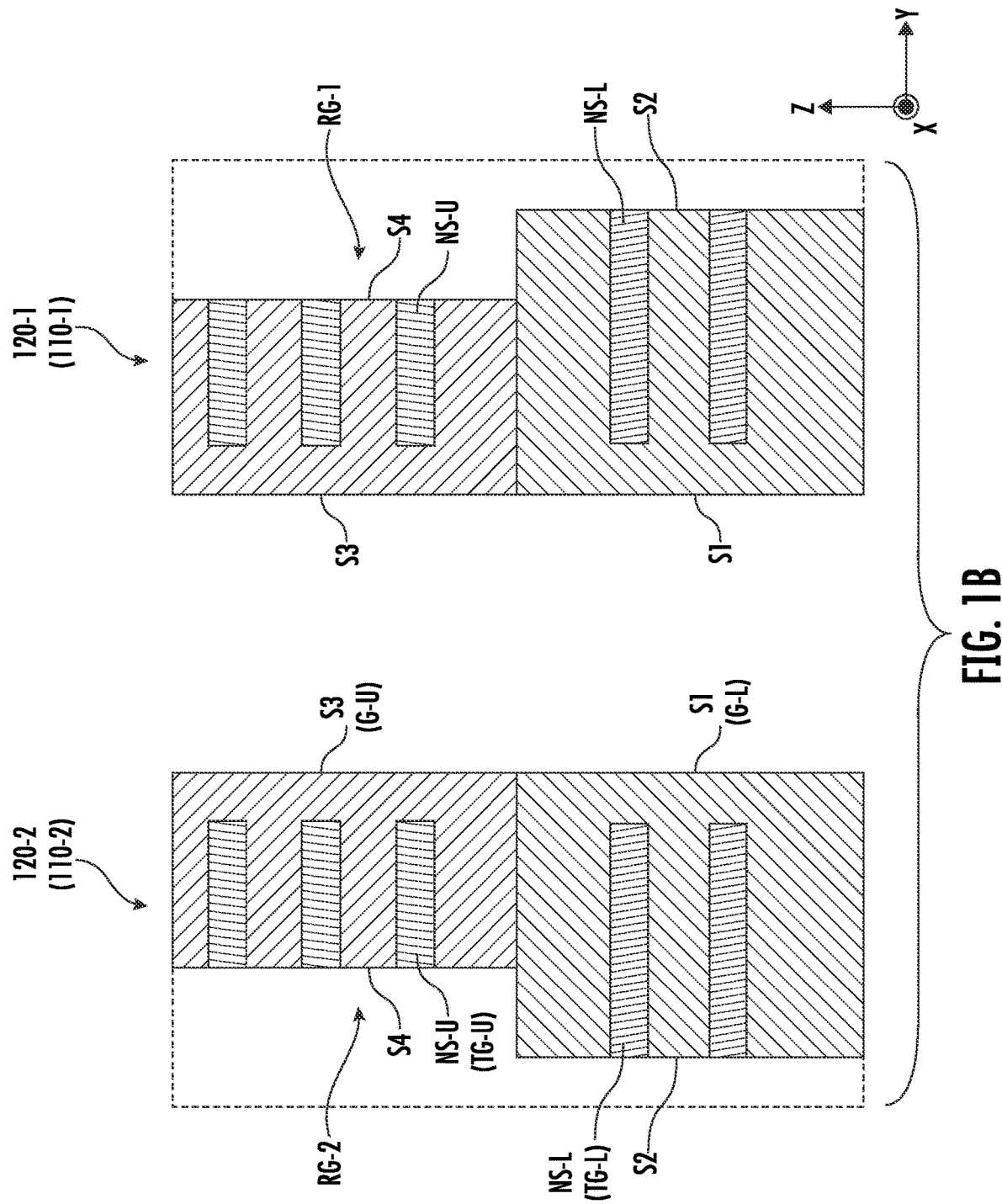
FIG. 1B is a cross-sectional view, taken along the direction Y, of the first and second nanosheet stacks of FIG. 1A.

FIG. 1B is a cross-sectional view, taken along the direction Y, of the first and second nanosheet stacks 120-1, 120-2 of FIG. 1A. As shown in FIG. 1B, each nanosheet stack 120 includes a plurality of lower nanosheets NS-L of a lower transistor TG-L and a plurality of upper nanosheets NS-U of an upper transistor TG-U. The upper nanosheets NS-U overlap the lower nanosheets NS-L in a vertical direction Z that is perpendicular to the horizontal directions X and Y.

The lower transistor TG-L further includes a lower gate G-L that is on the lower nanosheets NS-L. In the cross-sectional view of FIG. 1B, the lower gate G-L is shown on three sides of each of the lower nanosheets NS-L. The upper transistor TG-U likewise further includes an upper gate G-U that is on three sides of each of the upper nanosheets NS-U in the cross-sectional view of FIG. 1B. Accordingly, the transistors TG-L, TG-U shown in FIG. 1B are each tri-gate nanosheet transistors. In some embodiments, the gates G-L, G-U may be provided by a continuous gate electrode that is shared by the tri-gate transistors TG-L, TG-U. Moreover, each transistor stack 110 (FIG. 1A) may, in some embodiments, be a complementary field-effect transistor ("CFET") stack in which the lower tri-gate transistor TG-L and the upper tri-gate transistor TG-U are N-type and P-type transistors, respectively, or vice versa. Furthermore, though tri-gate transistors TG-L, TG-U are shown in FIG. 1B, other types of transistors, such as gate-all-around ("GAA") transistors (FIGS. 1E, 1F, 2B), may include nanosheets NS.

The lower gate G-L has opposite sidewalls S1, S2, and the upper gate G-U has opposite sidewalls S3, S4. The gate-free region RG is adjacent the sidewall S4 and vertically overlaps the lower gate G-L and the lower nanosheets NS-L. In some embodiments, the gate-free region RG may also be adjacent the sidewall S2. As shown in FIGS. 1A and 1B, the nanosheet stacks 120-1, 120-2 are mirror symmetrical, in that the gate-free regions RG-1, RG-2 face away from each other along the direction Y, as do the source/drain contacts 140-1, 140-2. The mirror symmetry thus increases a distance between the source/drain contacts 140-1, 140-2.

Moreover, the upper nanosheets NS-U may, in some embodiments, provide a fork sheet that extends in the direction Y toward the sidewall S3, where the sidewall S3 of the upper gate G-U of the first transistor stack 110-1 is opposite (i.e., faces) the sidewall S3 of the upper gate G-U of the second transistor stack 110-2. As a result, the upper nanosheets NS-U of the upper tri-gate transistor TG-U of the first transistor stack 110-1 and the upper nanosheets NS-U of the upper tri-gate transistor TG-U of the second transistor stack 110-2 have opposite fork-sheet directions from each other. As shown in FIG. 1B, upper nanosheets NS-U may have the same fork-sheet direction as lower nanosheets NS-L that are thereunder in a transistor stack 110. In other embodiments, however, upper nanosheets NS-U of a transistor stack 110 may have an opposite fork-sheet direction from that of lower nanosheets NS-L that are in the transistor stack 110, as described herein with respect to FIG. 1D.

Figure 1C:
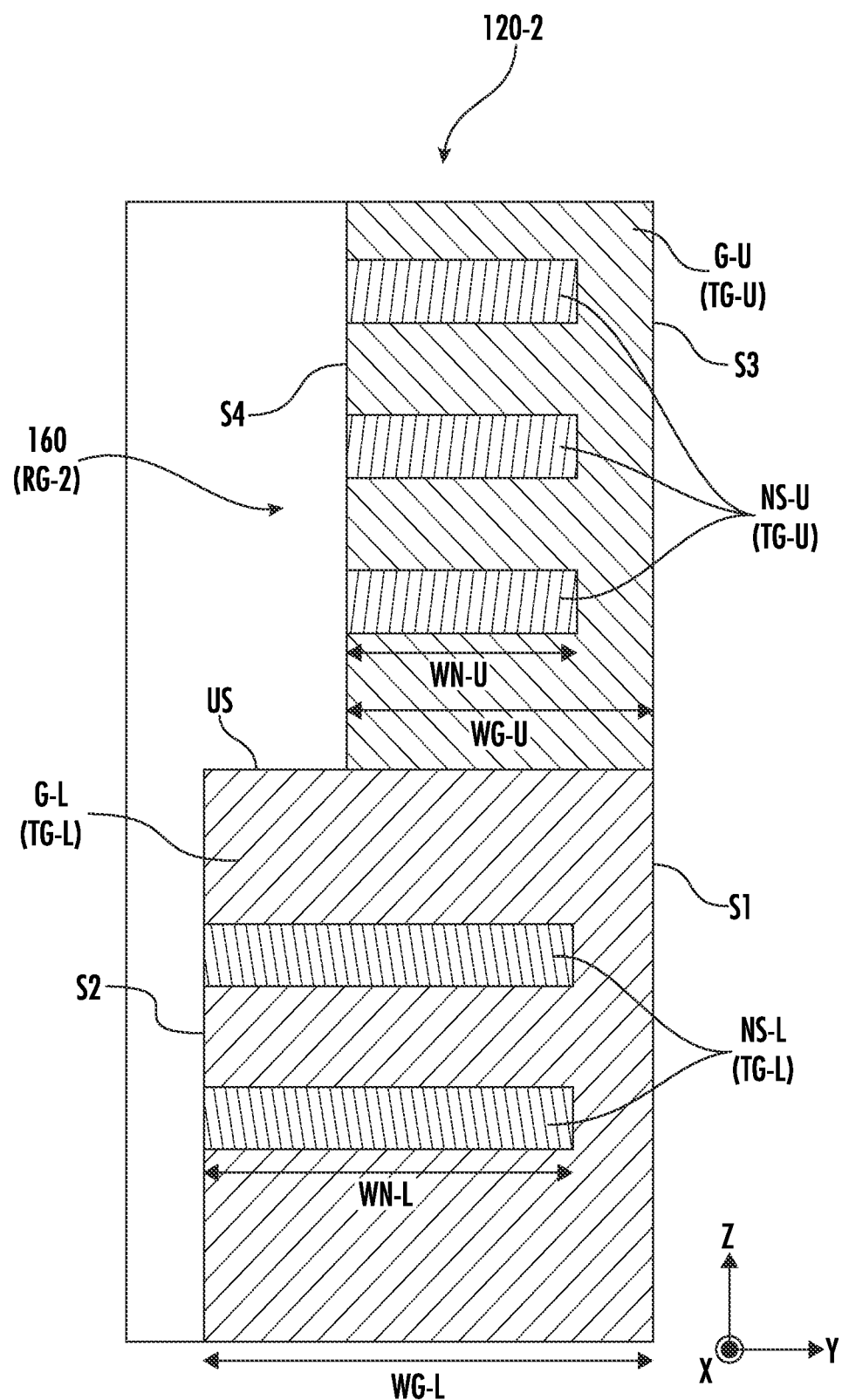
FIG. 1C is an enlarged view of the second nanosheet stack of FIG. 1B.

FIG. 1C is an enlarged view of the second nanosheet stack 120-2 of FIG. 1B. As shown in FIG. 1C, the gate-free region RG may comprise an insulation region 160 that is on an upper surface US of the lower gate G-L and the sidewall S4 of the upper gate G-U. Moreover, the insulation region 160 may contact respective sidewalls of the upper nanosheets NS-U and may vertically overlap the lower nanosheets NS-L. The insulation region 160 may comprise, for example, silicon nitride or silicon oxide. In some embodiments, the insulation region 160 may comprise a low-k spacer, which can provide better capacitance-reduction than a higher-k insulator. As used herein, the term "low-k" refers to a material that has a smaller dielectric constant than silicon dioxide.

FIG. 1C also illustrates that the upper nanosheets NS-U each have a width WN-U that is different from a width WN-L of each of the lower nanosheets NS-L. The nanosheet stack 120-2 is thus an sNS structure. Example sNS structures are discussed in U.S. Provisional Patent Application Ser. No. 63/086,781, filed on Oct. 2, 2020, the disclosure of which is hereby incorporated herein in its entirety by reference. Specifically, the width WN-U is narrower than the width WN-L. Moreover, due to the gate-free region RG, a width WG-U of the upper gate G-U is narrower than a width WG-L of the lower gate G-L. The narrower width WG-U can reduce parasitic capacitance between the upper gate G-U and a source/drain contact 140 (FIG. 1A), as well as parasitic capacitance between the upper gate G-U and source/drain regions 150 (FIG. 1A).

Due to its wider gate width WG-L and wider nanosheet width WN-L, the lower tri-gate transistor TG-L can have fewer (e.g., two versus three) nanosheets than the upper tri-gate transistor TG-U, while still having the same total nanosheet cross-sectional area (and/or the same total nanosheet surface area) as the upper tri-gate transistor TG-U. In some embodiments, as shown in FIG. 1C, the sidewall S3 of the upper gate G-U may be aligned with the sidewall S1 of the lower gate G-L. The sidewall S4, however, of the upper gate G-U may vertically overlap the lower nanosheets NS-L, given the narrower width WG-U of the upper gate G-U.

Figure 3A:
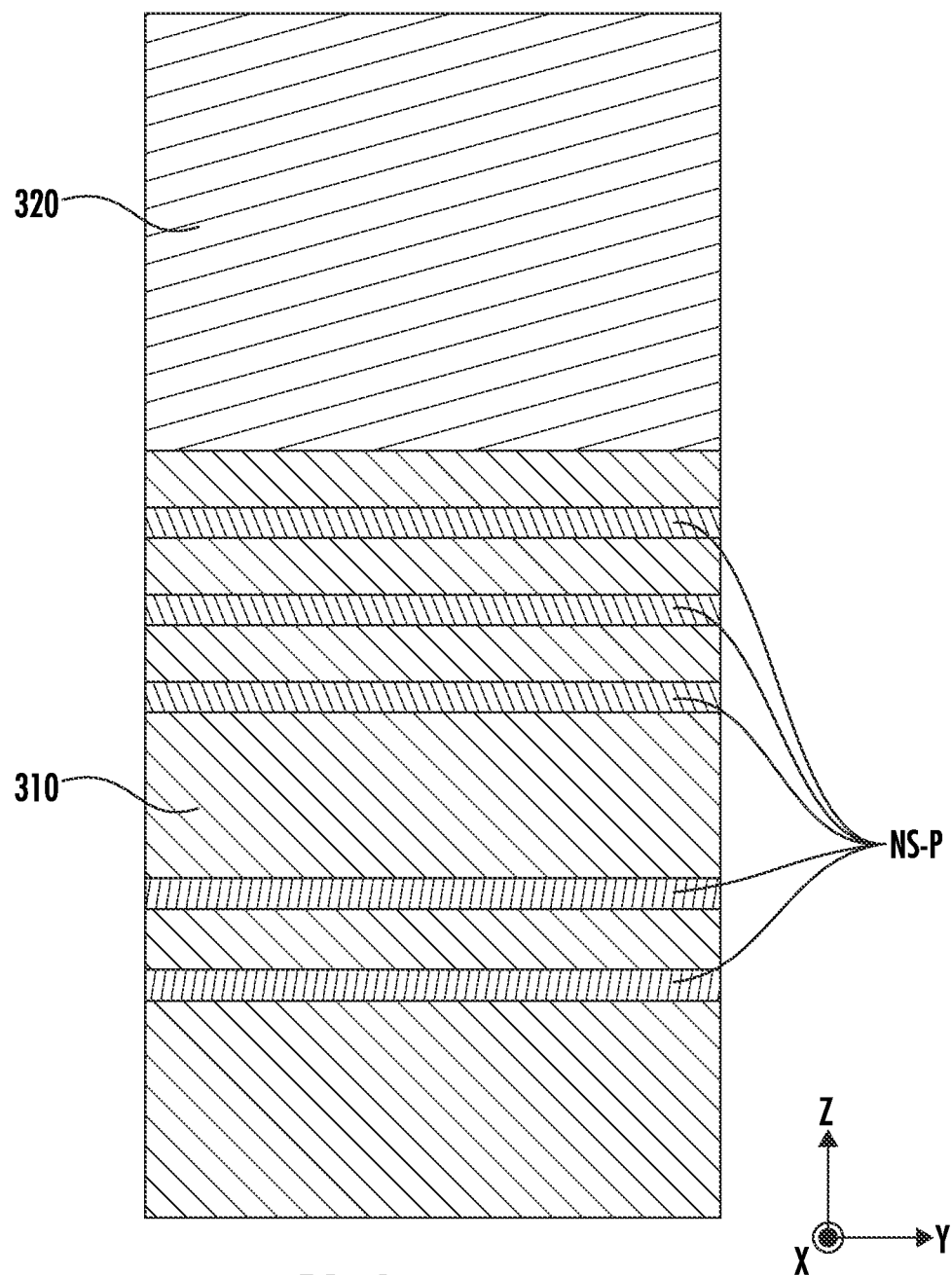
FIGS. 3A-3N are cross-sectional views illustrating operations of forming the nanosheet stack of FIG. 1C.

Moreover, because the transistors TG-L, TG-U are tri-gate transistors, the lower nanosheets NS-L are spaced apart from the sidewall S1 by a material (e.g., metal) of the lower gate G-L and the upper nanosheets NS-U are spaced apart from the sidewall S3 by a material (e.g., metal) of the upper gate G-U. For example, a first distance in the direction Y between the sidewall S1 and the lower nanosheets NS-L may be calculated by subtracting the width WN-L from the width WG-L. Likewise, a second distance in the direction Y between the sidewall S3 and the upper nanosheets NS-U may be calculated by subtracting the width WN-U from the width WG-U. In some embodiments, the first distance may equal the second distance, such as when the nanosheet stack 120 is formed according to the operations that are shown in FIGS. 3A-3N.

For simplicity of illustration, a gate insulation layer is omitted from view in FIG. 1C. It will be understood, however, that a gate insulation layer may extend between each nanosheet NS and the gate G. Also, for simplicity of illustration, a substrate is omitted from view in FIG. 1C. It will be understood, however, that the nanosheets NS may be vertically stacked on a substrate. Specifically, the lower tri-gate transistor TG-L may be between the upper tri-gate transistor TG-U and the substrate.

Figure 1D:
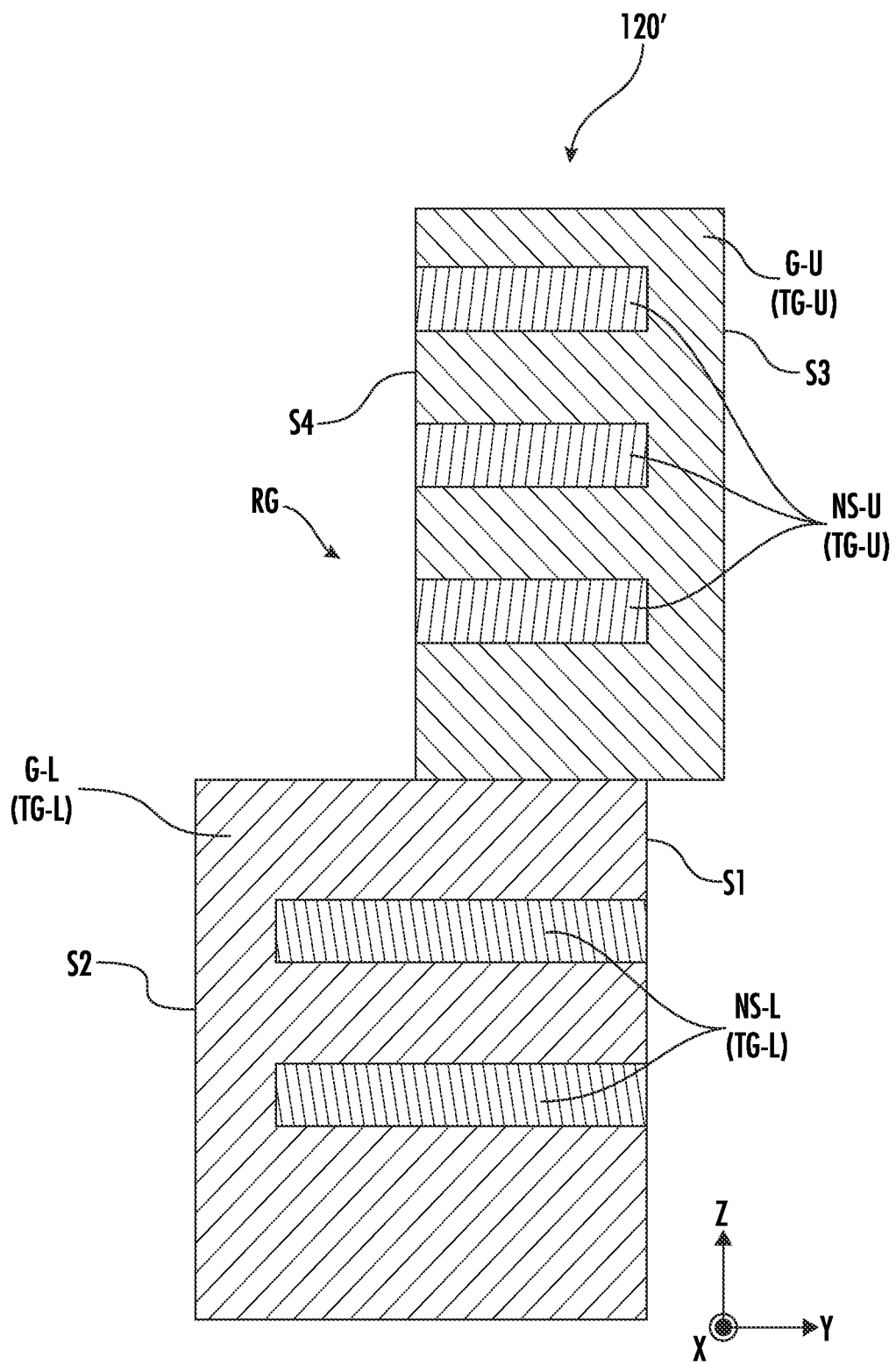
FIGS. 1D-1F are cross-sectional views of nanosheet stacks according to other embodiments of the present invention.
Figure 1E:
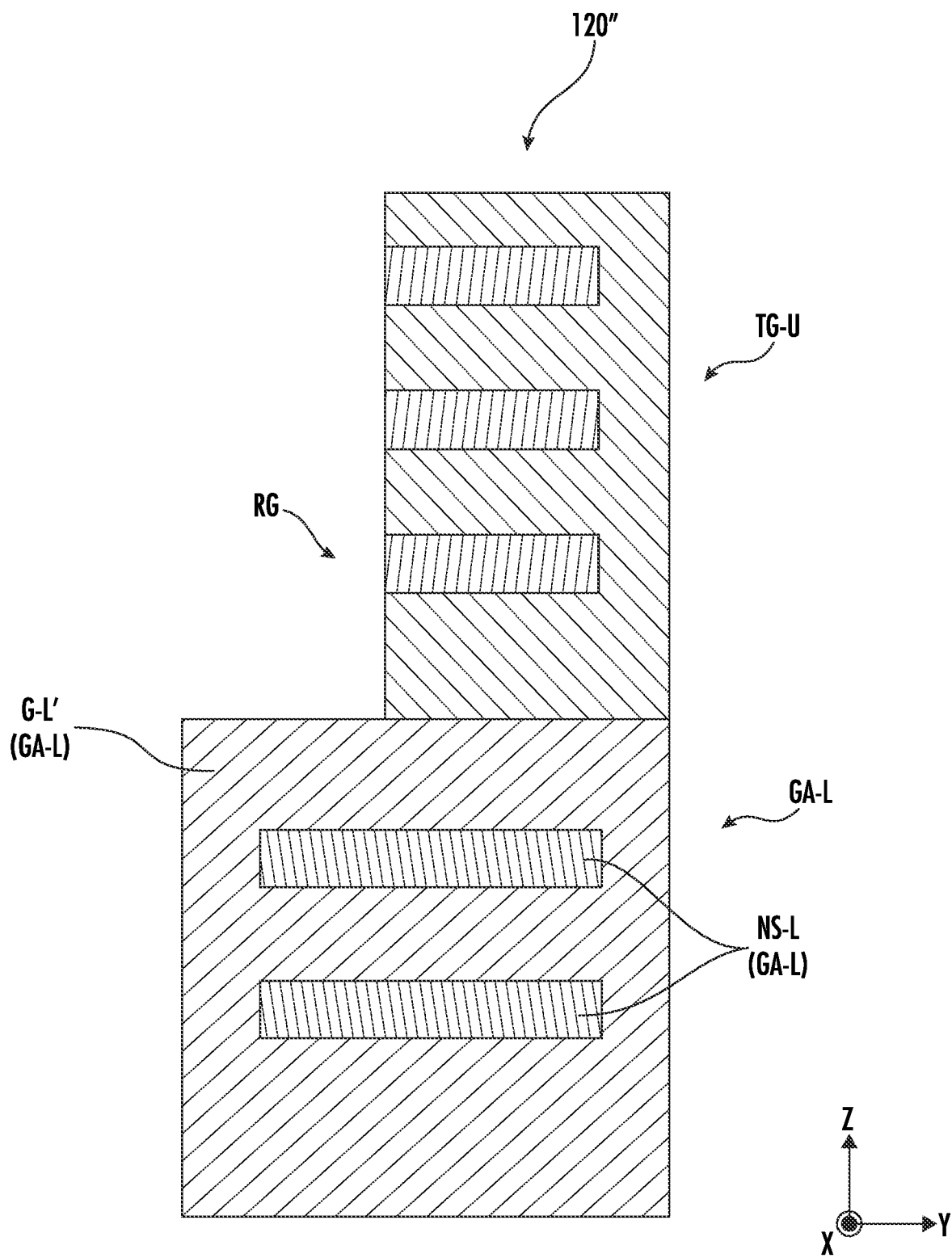
Figure 1F:
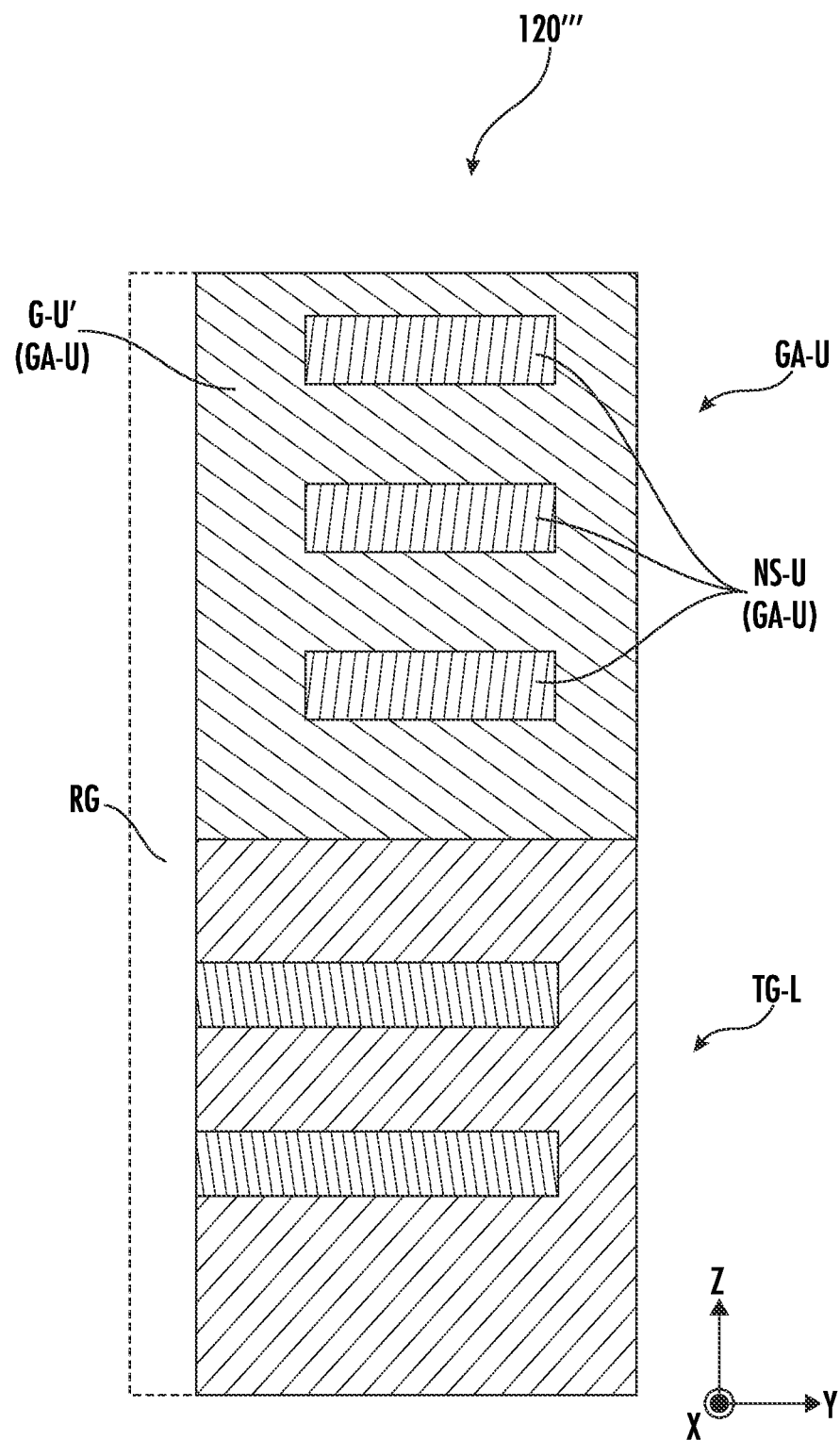

FIGS. 1D-1F are cross-sectional views of nanosheet stacks 120', 120", and 120''', respectively, according to other embodiments of the present invention. As shown in FIG. 1D, the sidewall S3 of the upper gate G-U may be offset from, rather than vertically aligned with, the sidewall S1 of the lower gate G-L. For example, the lower nanosheets NS-L may be spaced apart from the sidewall S2, rather than the sidewall S1, by a material of the lower gate G-L such that the lower nanosheets NS-L have a fork-sheet direction that is opposite a fork-sheet direction of the upper nanosheets NS-U.

A transistor stack 110 (FIG. 1A) is not limited to tri-gate transistors. Rather, the transistor stack 110 may include both a tri-gate transistor and a GAA transistor.

For example, referring to FIG. 1E, the lower nanosheets NS-L may be surrounded by a gate G-L' of a GAA transistor GA-L. A tri-gate transistor TG-U is stacked above the GAA transistor GA-L. As another example, referring to FIG. 1F, the upper nanosheets NS-U may be part of a GAA transistor GA-U that is stacked above a tri-gate transistor TG-L.

Though the gate G-U' of the GAA transistor GA-U is shown in FIG. 1F as having a similar width in the direction Y as a gate of the tri-gate transistor TG-L, the gate G-U' may, in some embodiments, have a narrower width due to a gate-free region RG of the GAA transistor GA-U. For example, the GAA transistor GA-U may have a wider gate-free region RG than the tri-gate transistor TG-L, or the tri-gate transistor TG-L may not have a gate-free region RG that is vertically overlapped by the gate-free region RG of the GAA transistor GA-U. Moreover, for simplicity of illustration, the insulation region 160 (FIG. 1C) is omitted from view in FIGS. 1D-1F. A gate-free region RG in any of FIGS. 1D-1F, however, may comprise the insulation region 160 therein. Also, a gate-free region RG may be in any of (i) a lower transistor, (ii) an upper transistor, or (iii) both the upper transistor and the lower transistor of a transistor stack 110 (FIG. 1A).

Figure 2A:
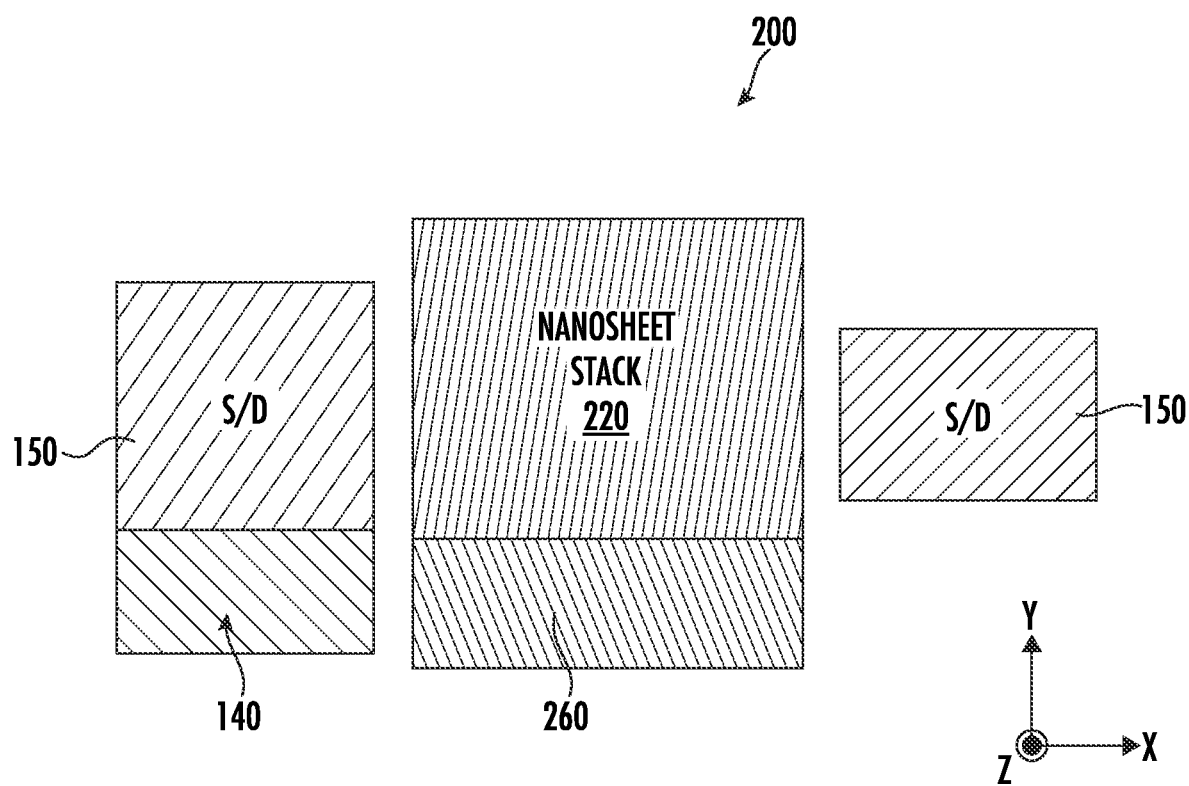
FIG. 2A is a plan view of a nanosheet transistor device according to further embodiments of the present invention.

FIG. 2A is a plan view of a nanosheet transistor device 200 according to further embodiments of the present invention. The device 200 comprises a transistor stack that includes a nanosheet stack 220 that is between, in the direction X, source/drain regions 150. To reduce parasitic capacitance with a source/drain contact 140 (and with the source/drain regions 150), the nanosheet stack 220 includes an insulation region 260. The insulation region 260 may comprise, for example, a low-k spacer. As an example, the insulation region 260 may be a lower-k region than another insulation region 280 (FIG. 2B) that is on the gate G. For simplicity of illustration, only one nanosheet stack 220 is shown in the device 200. In some embodiments, however, the device 200 may include two, three, four, or more nanosheet stacks 220.

For simplicity of illustration, only one source/drain contact 140 is shown in FIG. 2A. In some embodiments, however, each source/drain region 150 may have a respective source/drain contact 140 adjacent thereto in the second horizontal direction Y. Accordingly, a pair of source/drain contacts 140 can be on opposite sides of the nanosheet stack 220.

Figure 2B:
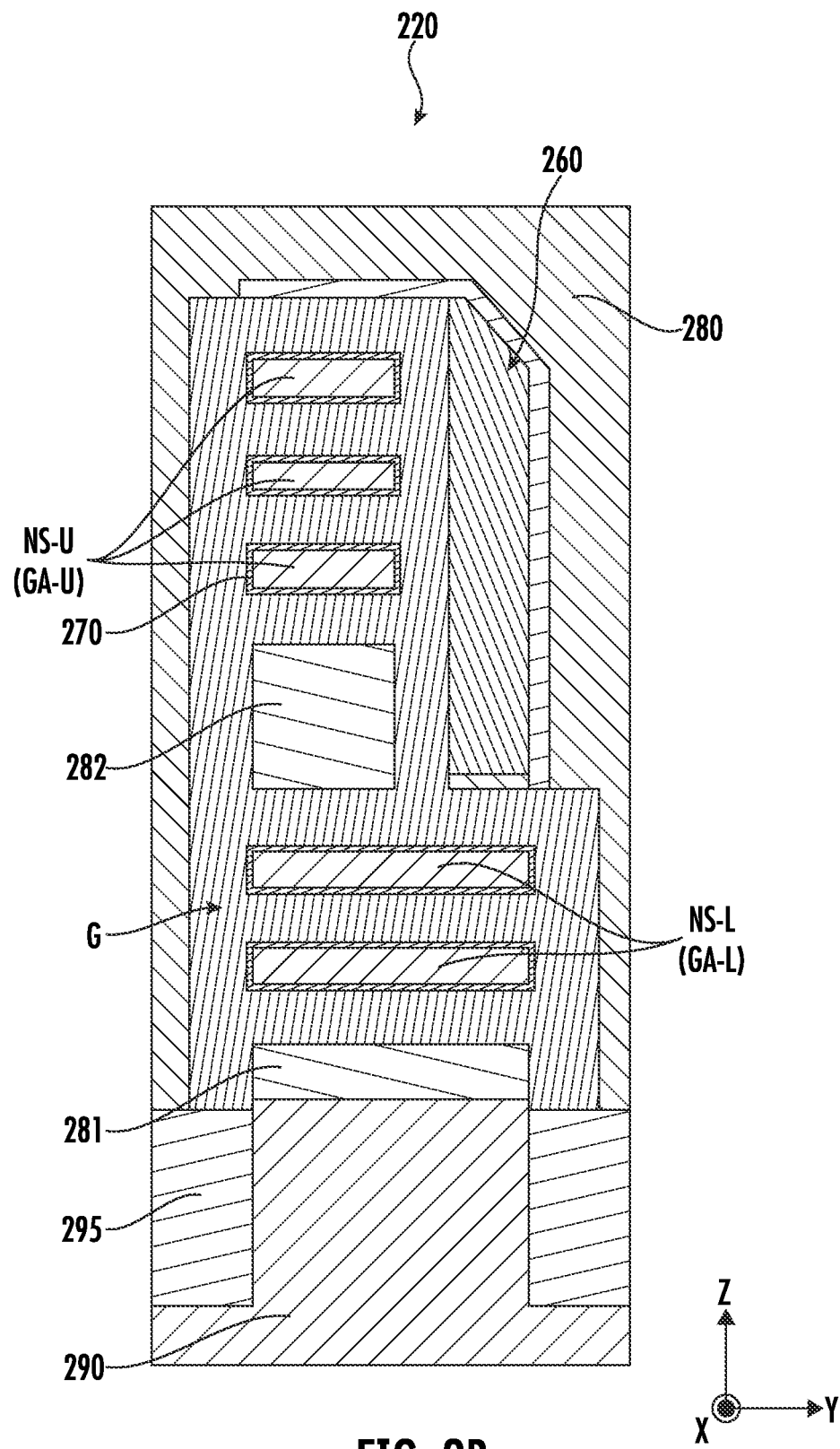
FIG. 2B is a cross-sectional view, taken along the direction Y, of the nanosheet stack of FIG. 2A.

FIG. 2B is a cross-sectional view, taken along the direction Y, of the nanosheet stack 220 of FIG. 2A. As shown in FIG. 2B, the nanosheet stack 220 includes a plurality of lower nanosheets NS-L that are vertically overlapped by a plurality of upper nanosheets NS-U, and further includes a gate G that is shared by the nanosheets NS-L, NS-U. Unlike the nanosheet stacks 120 (FIG. 1B) of tri-gate transistors TG (FIG. 1B), the nanosheets NS-L, NS-U of the nanosheet stack 220 are all surrounded by the gate G (e.g., by a metal gate electrode). The nanosheets NS-L, NS-U of the nanosheet stack 220 are thus nanosheets of a lower GAA transistor GA-L and an upper GAA transistor GA-U, respectively. Accordingly, each vertically-stacked transistor of the device 200 (FIG. 2A) may be a GAA transistor GA. Moreover, each stack of two transistors in the device 200 may, in some embodiments, be a CFET stack in which the lower GAA transistor GA-L and the upper GAA transistor GA-U are N-type and P-type transistors, respectively, or vice versa.

The insulation region 260 may contact a sidewall of the gate G of the upper GAA transistor GA-U, and may be between the sidewall of the gate G and the insulation region 280. The insulation region 280 may contact an opposite sidewall of the gate G of the upper GAA transistor GA-U, and may be on an upper surface of the gate G of the upper GAA transistor GA-U. Moreover, the insulation region 260 may be on an upper surface of the gate G of the lower GAA transistor GA-L, and may vertically overlap the lower nanosheets NS-L.

As is further shown in FIG. 2B, the nanosheets NS are vertically stacked on an upper surface of a vertically-protruding portion of a substrate 290, and device isolation regions 295 are on opposite sides of the vertically-protruding portion. The lower GAA transistor GA-L may be between the upper GAA transistor GA-U and the substrate 290, which may be, for example, a semiconductor substrate. FIG. 2B also illustrates that an insulation region 281 may be between the lower nanosheets NS-L and the upper surface of the vertically-protruding portion of the substrate 290, and that an insulation region 282 may be between the upper nanosheets NS-U and the lower nanosheets NS-L. In some embodiments, however, the insulation regions 281, 282 may be omitted. Moreover, FIG. 2B illustrates a gate insulation layer 270, which may extend between each nanosheet NS and the gate G.

FIGS. 3A-3N are cross-sectional views illustrating operations of forming the nanosheet stack 120 of FIG. 1C. Referring to FIG. 3A, a sacrificial material 310 may be between vertically-stacked preliminary nanosheets NS-P, which may have equal widths in the direction Y. The sacrificial material 310 may comprise, for example, a semiconductor material, such as silicon germanium, and the preliminary nanosheets NS-P may each be, for example, a silicon sheet. The sacrificial material 310 and the preliminary nanosheets NS-P may collectively be referred to herein as a "preliminary transistor stack."

An insulating material 320 may be on the preliminary nanosheets NS-P and the sacrificial material 310. As an example, the insulating material 320 may be an oxide or nitride, such as silicon oxide or silicon nitride. The insulating material 320 may serve as an etch mask (e.g., a hard mask) that protects the preliminary nanosheets NS-P and the sacrificial material 310.

Figure 3B:
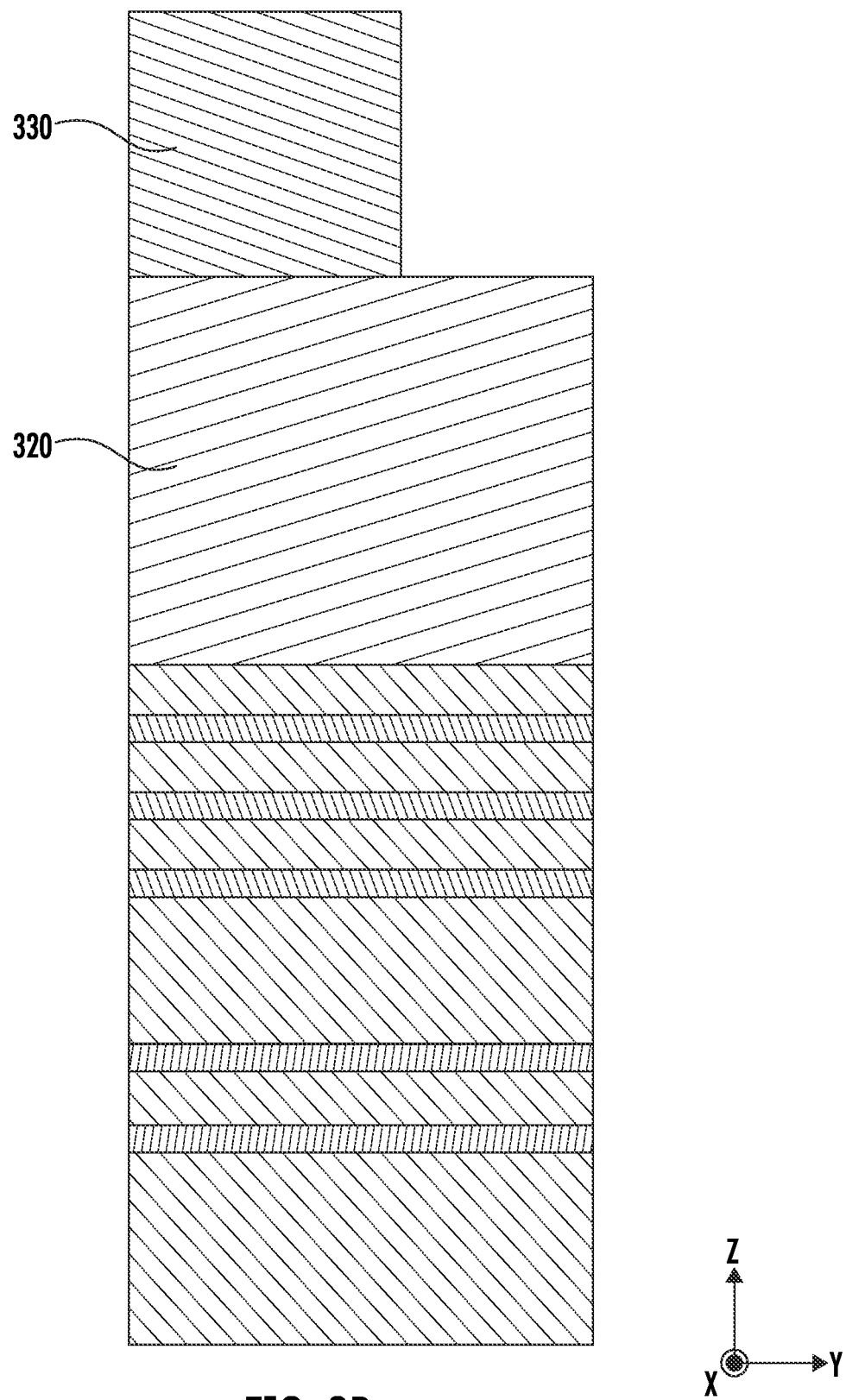

Referring to FIG. 3B, an insulating material 330 having an etch selectivity with respect to the insulating material 320 is formed on the insulating material 320. For example, the insulating material 330 may be silicon oxide if the insulating material 320 is silicon nitride, and the insulating material 330 may be silicon nitride if the insulating material 320 is silicon oxide. As shown in FIG. 3B, the insulating material 330 exposes a portion of an upper surface of the insulating material 320.

Figure 3C:
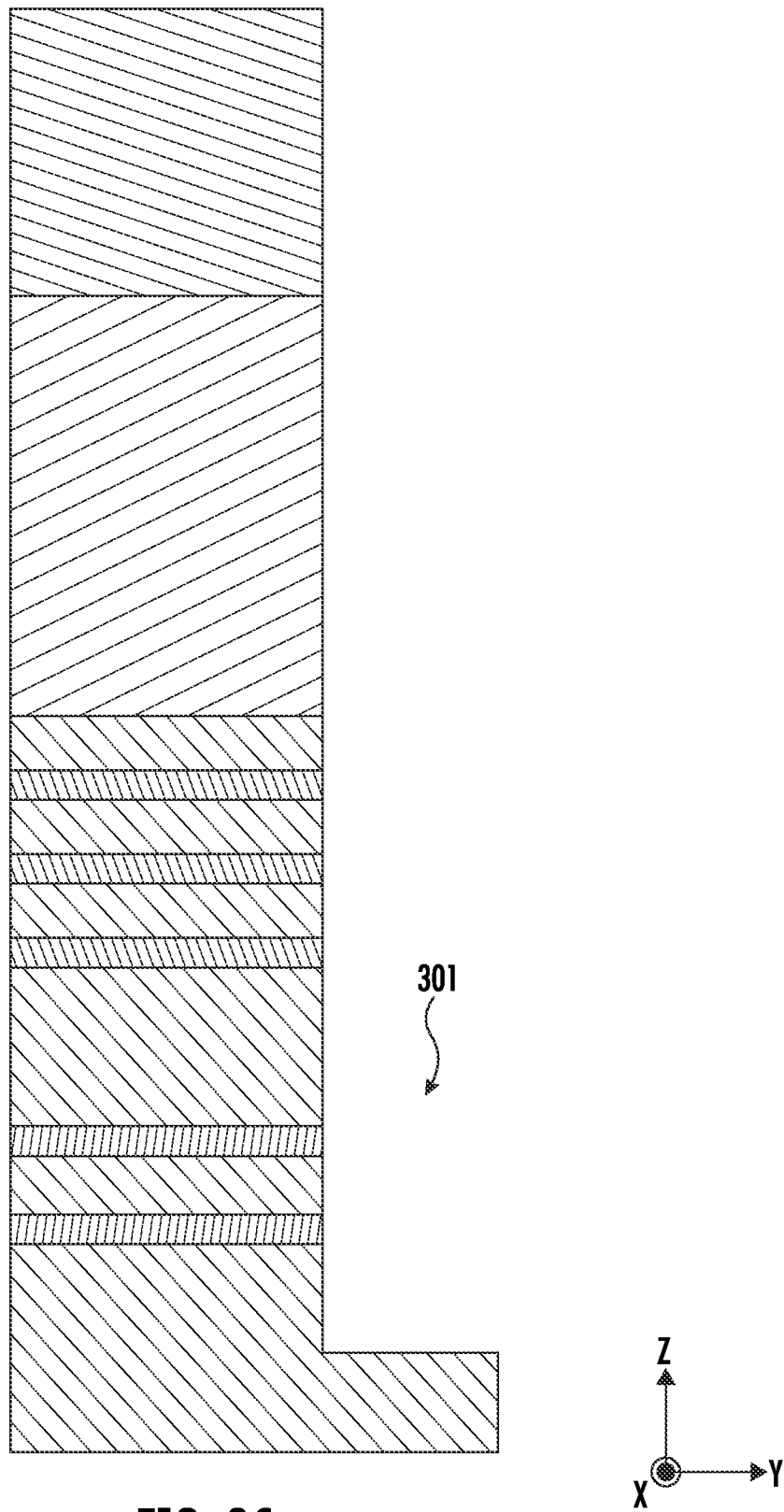

Referring to FIG. 3C, the exposed portion of the insulating material 320 (FIG. 3B) is removed, along with underlying portions of the preliminary nanosheets NS-P (FIG. 3A) and the sacrificial material 310 (FIG. 3A), to form a recess region 301. For example, the insulating material 330 (FIG. 3B) may be used as an etch mask (e.g., a hard mask) while etching the exposed portion of the insulating material 320.

Figure 3D:
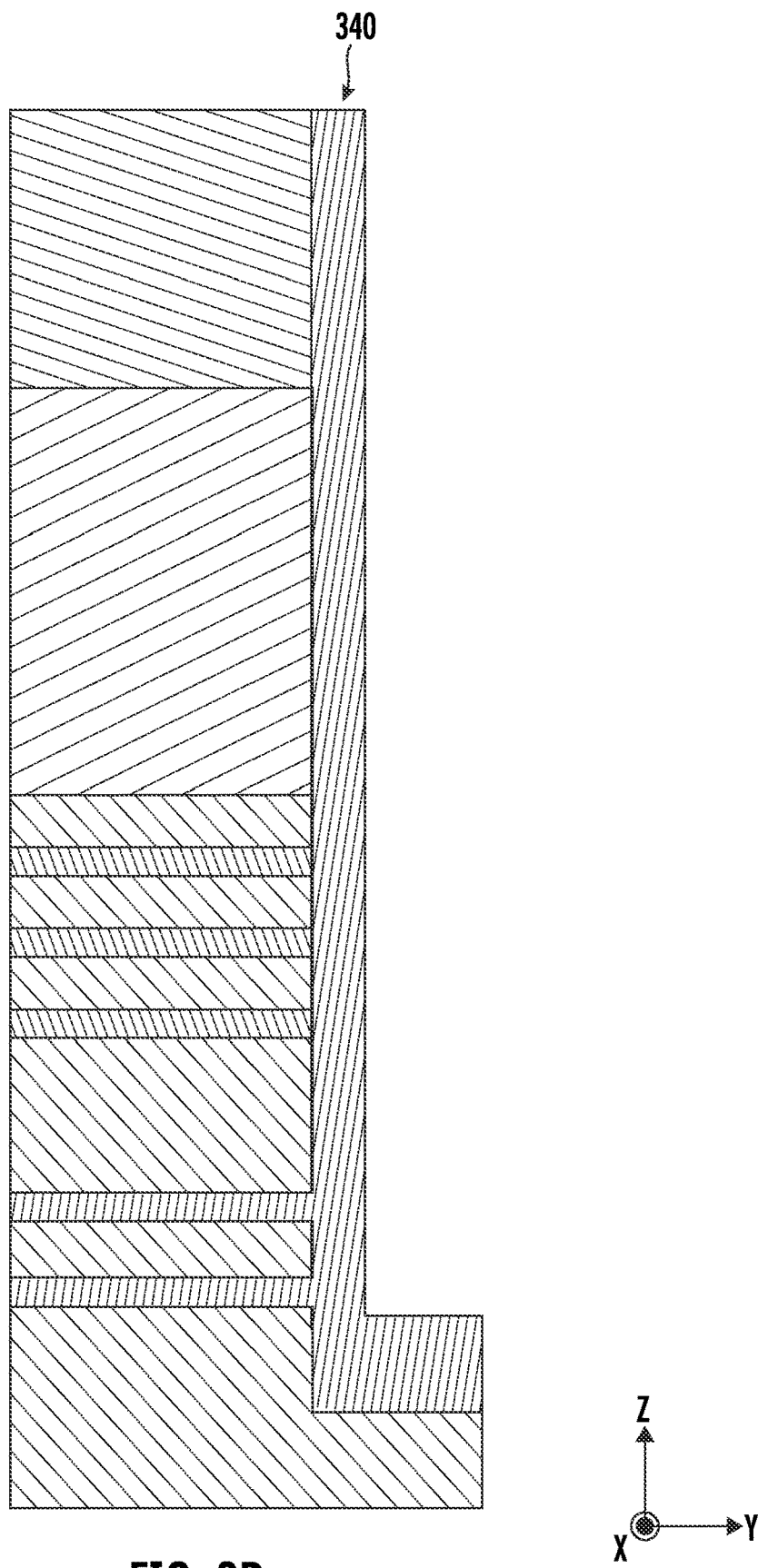

Referring to FIG. 3D, a spacer 340 is formed in the recess region 301 (FIG. 3C) and on sidewalls of the sacrificial material 310, the preliminary nanosheets NS-P, and the insulating materials 320, 330 (FIGS. 3A and 3B). The spacer 340 may comprise, for example, an oxide, such as silicon oxide.

Figure 3E:
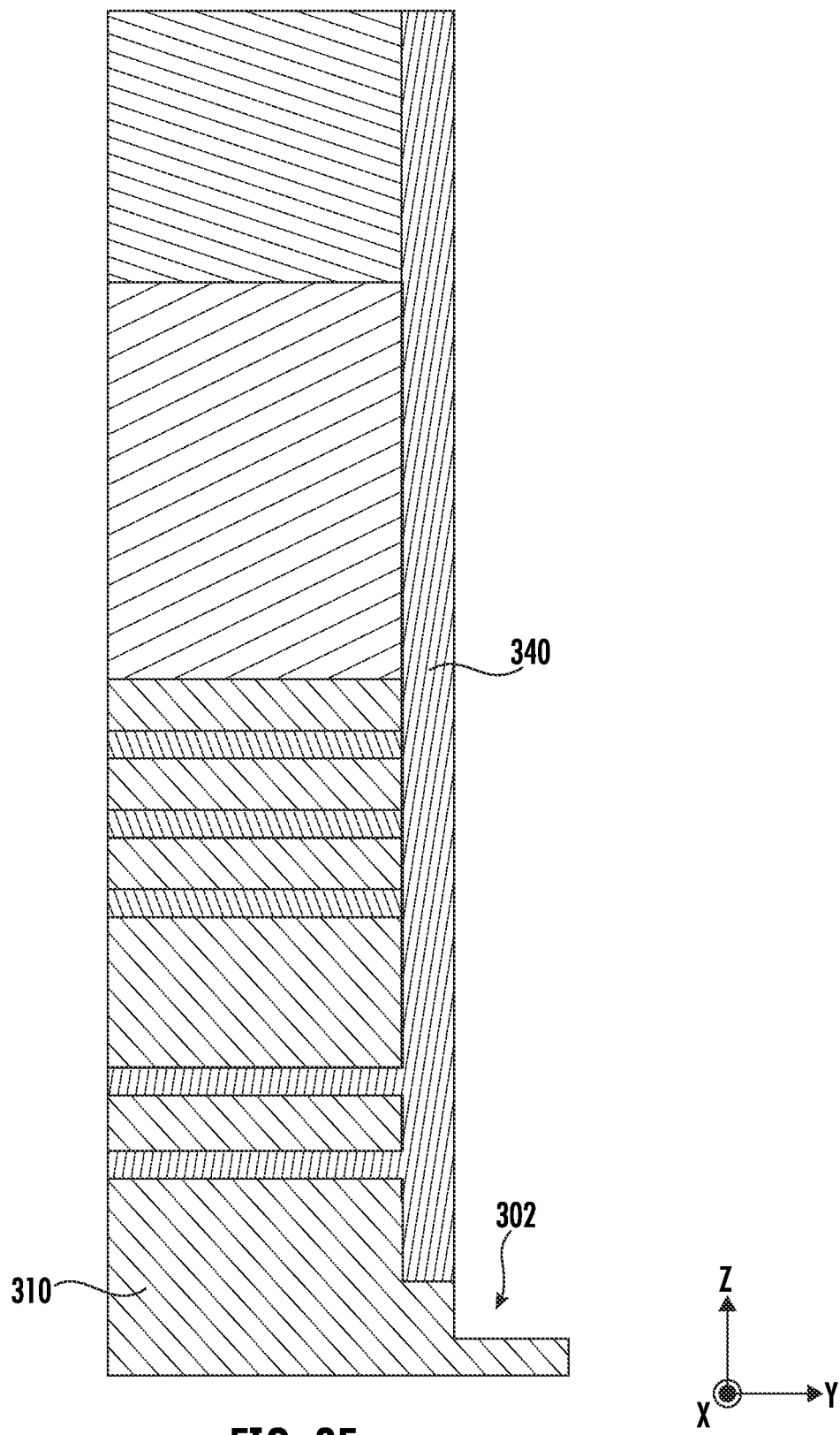

Referring to FIG. 3E, a portion of the spacer 340 that protrudes in the direction Y may be removed to form a recess region 302 that exposes an upper surface and a sidewall of the sacrificial material 310.

Figure 3F:
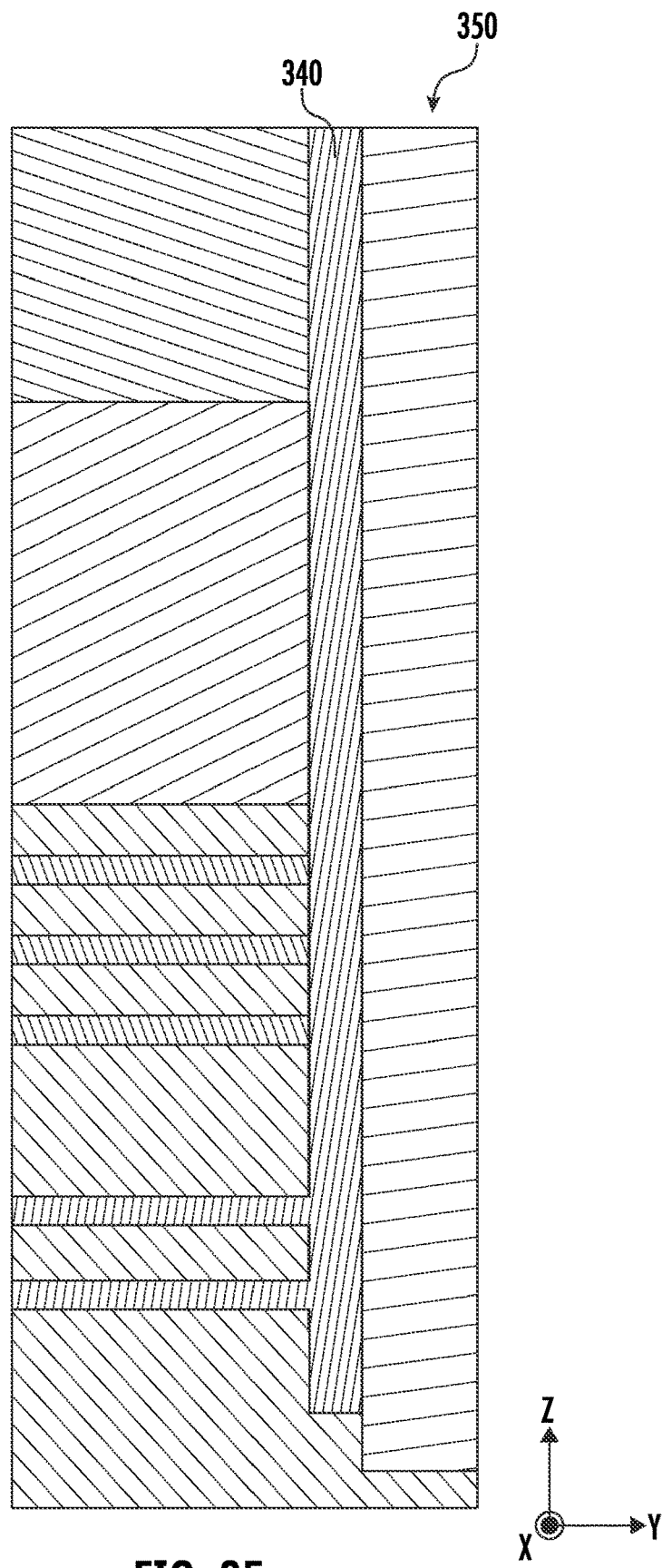

Referring to FIG. 3F, an insulating material 350 is formed in the recess region 302 (FIG. 3E) and on a sidewall of the spacer 340. The insulating material 350 has an etch selectivity with respect to the spacer 340. For example, the insulating material 350 comprises an oxide if the spacer 340 comprises a nitride, and the insulating material 350 comprises a nitride if the spacer 340 comprises an oxide. As an example, the insulating material 350 may comprise silicon nitride.

Figure 3G:
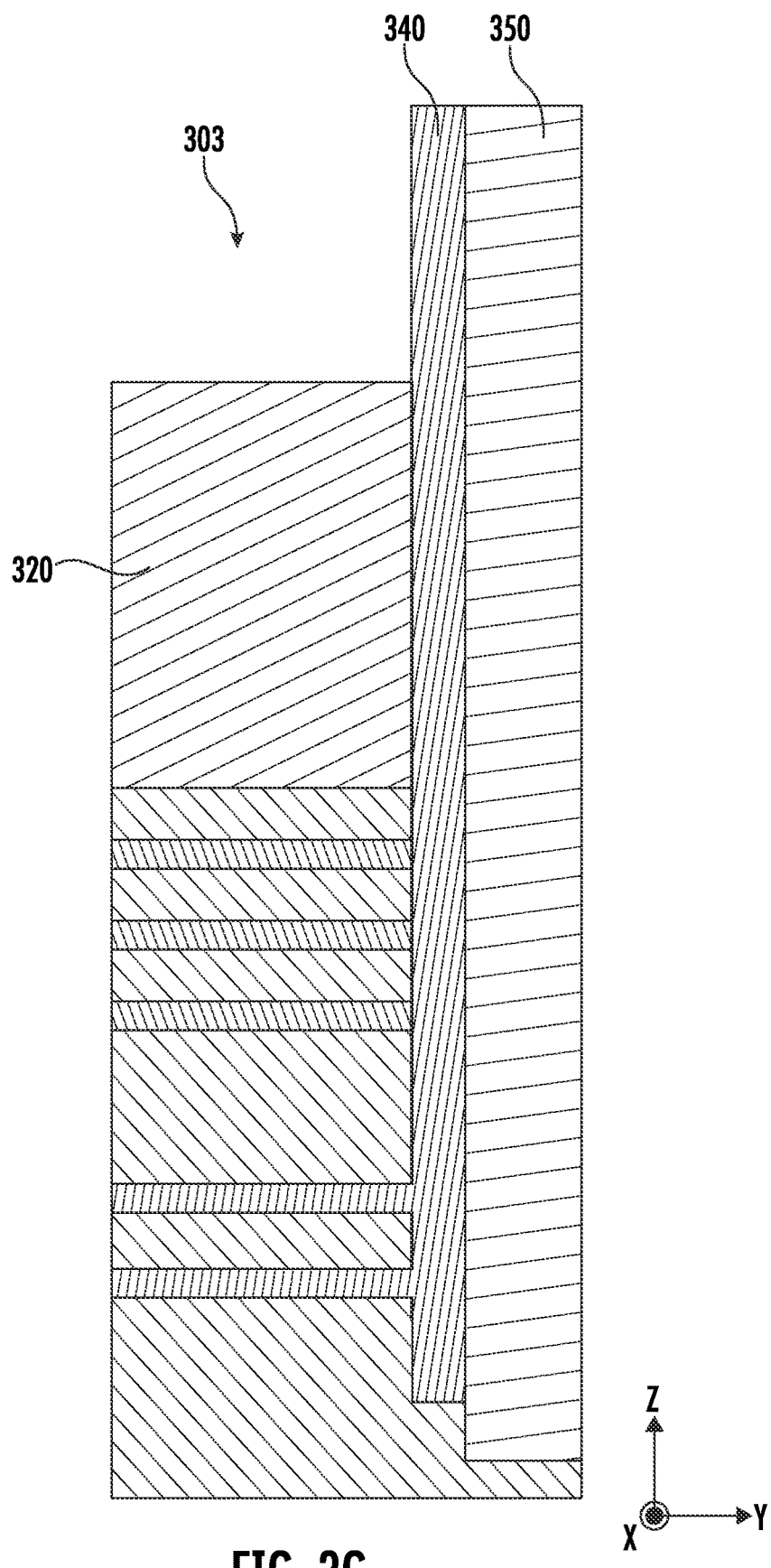

Referring to FIG. 3G, the insulating material 330 (FIG. 3B) is removed to form a recess region 303 that exposes an upper surface of the remaining portion of the insulating material 320 and a portion of a sidewall of the spacer 340.

Figure 3H:
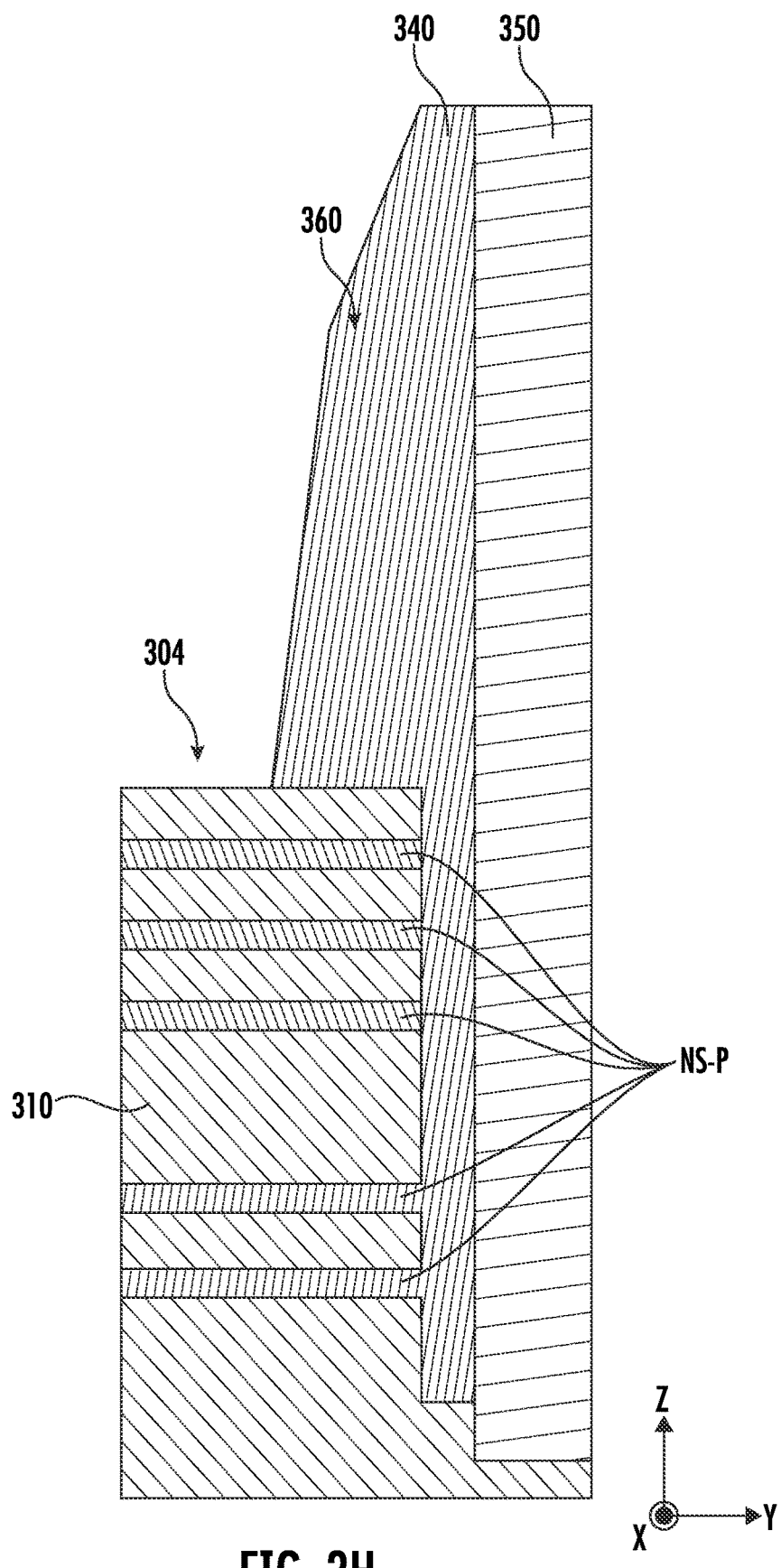

Referring to FIG. 3H, the insulating material 320 (FIG. 3G) is removed (e.g., by using a selective etching process) to form a recess region 304 that exposes an upper surface of the sacrificial material 310 and a portion of a sidewall of the spacer 340. Also, an insulating material 360 is formed (e.g., deposited) on the sidewall of the spacer 340. The insulating material 360 and the spacer 340 may comprise the same material (e.g., silicon oxide or silicon nitride).

Figure 3I:
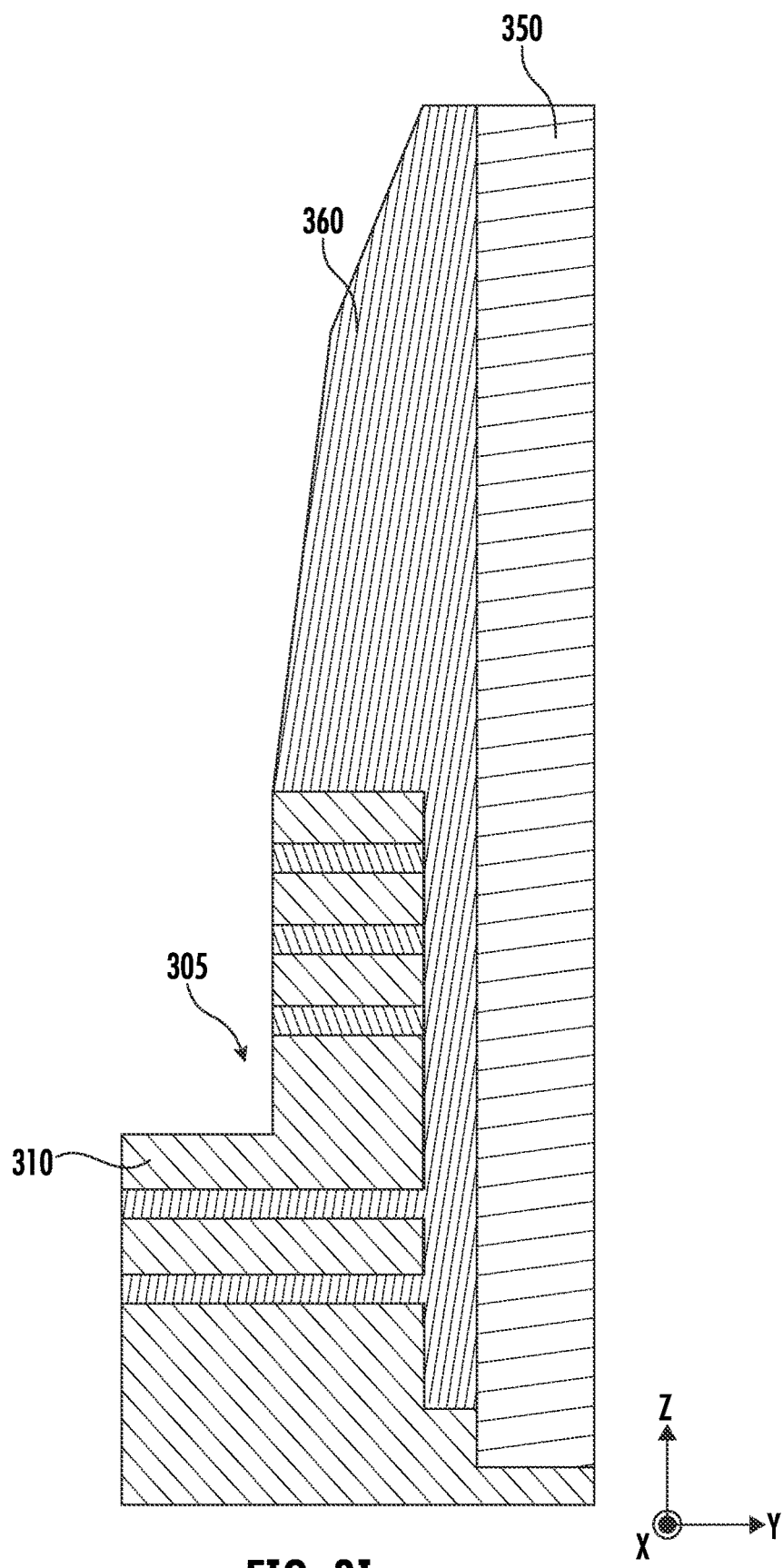

Referring to FIG. 3I, a portion of an upper surface of the sacrificial material 310 that remains exposed after forming the insulating material 360 is removed, along with an underlying portion of the three uppermost nanosheets NS of the preliminary nanosheets NS-P (FIG. 3A) to a point about midway between the upper nanosheet stack and the lower nanosheet stack. As a result, the three uppermost nanosheets NS are narrower, in the direction Y, than the two lowermost nanosheets NS. Moreover, this removal forms a recess region 305 that exposes sidewalls of the three uppermost nanosheets NS and exposes an upper surface of the sacrificial material 310 that vertically overlaps the two lowermost nanosheets NS.

Figure 3J:
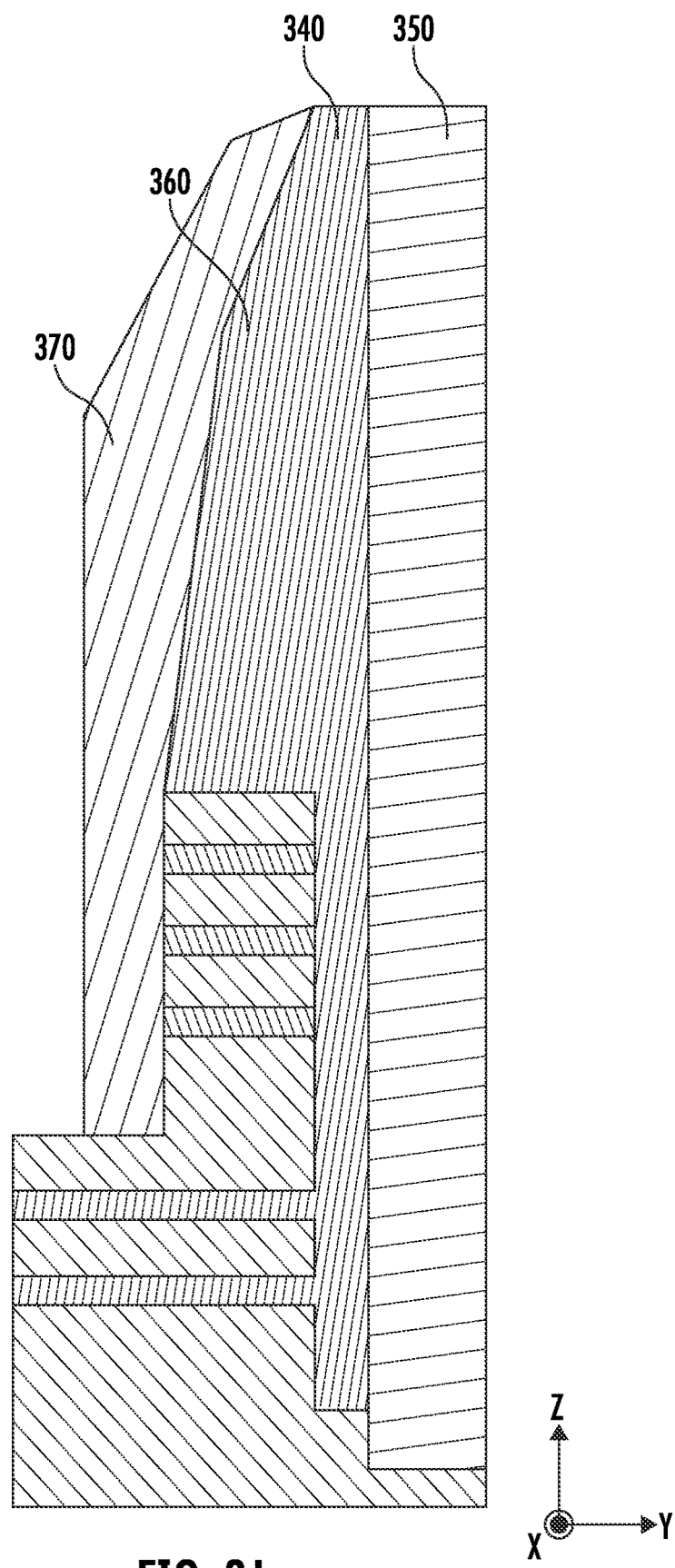

Referring to FIG. 3J, a spacer 370 is formed (e.g., by depositing another insulating material) on the insulating material 360 and on the exposed sidewalls of the three uppermost nanosheets NS. The spacer 370 overlaps the two lowermost nanosheets NS and contacts sidewalls of a portion of the three uppermost nanosheets NS that remains after forming the recess region 305. The spacer 370 may comprise, for example, silicon nitride or silicon oxide, and may have an etch selectivity with respect to the spacer 340 and the insulating material 360.

Figure 3K:
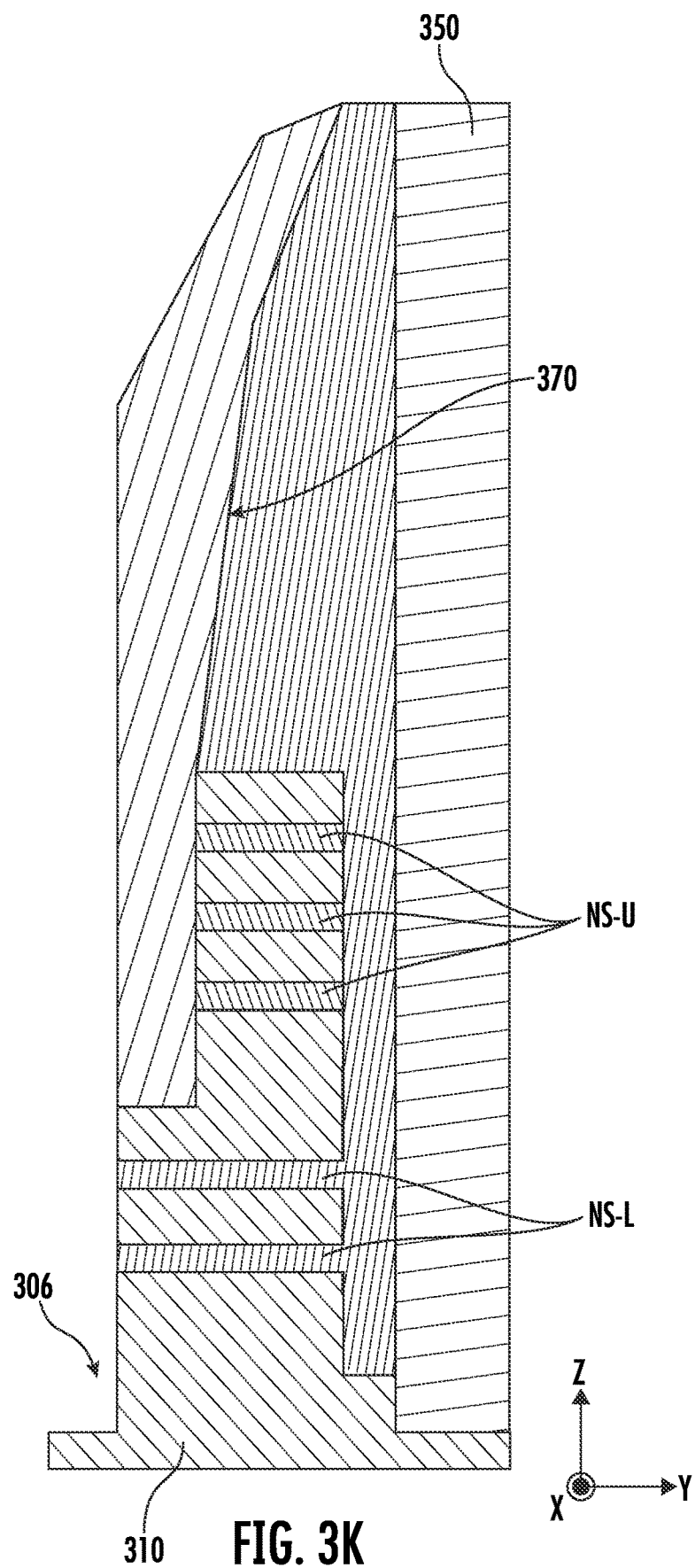

Referring to FIG. 3K, a recess region 306 is formed by removing an exposed portion of the upper surface of the sacrificial material 310, along with underlying portions of the two lowermost nanosheets NS, thus forming two lower nanosheets NS-L. The recess region 306 exposes sidewalls of the two lower nanosheets NS-L. The nanosheets NS-L are vertically overlapped by the spacer 370 and by upper nanosheets NS-U, which are the three uppermost nanosheets NS.

Figure 3L:
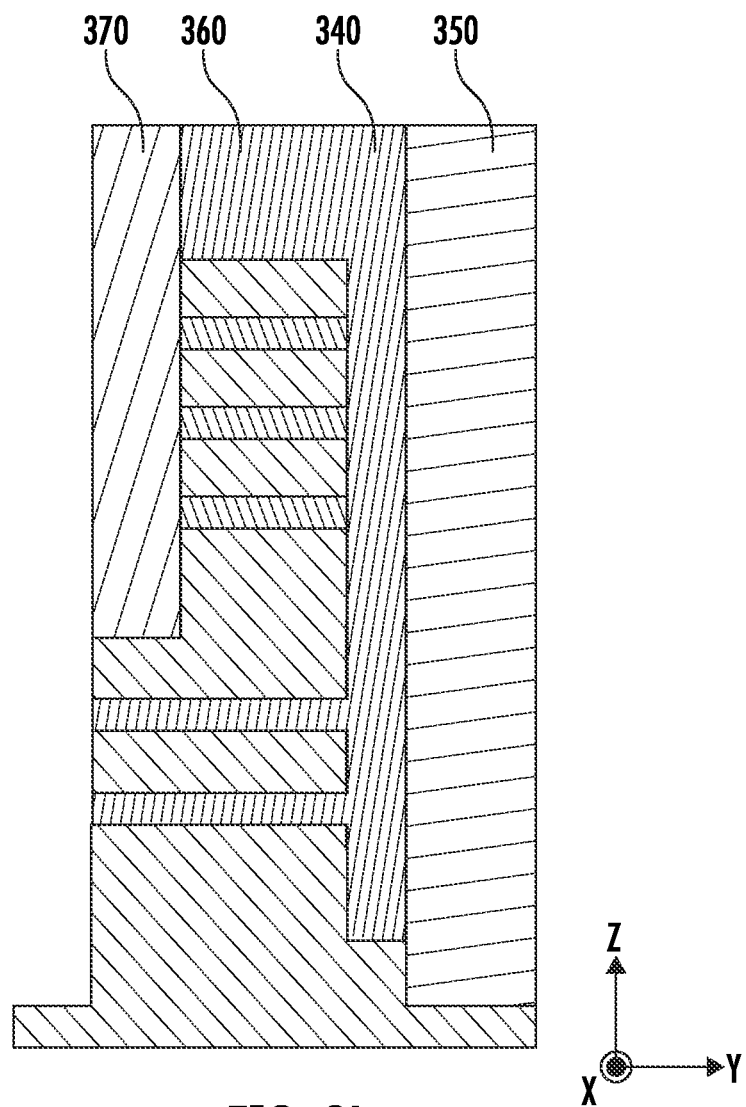

Referring to FIG. 3L, a planarization process (e.g., chemical mechanical planarization) is performed to remove upper portions of the spacer 340, the spacer 370, the insulating material 360, and the insulating material 350. For example, the planarization process may remove tilted surfaces of the spacer 370 and the insulating material 360, and result in upper surfaces of the spacer 340, the spacer 370, the insulating material 360, and the insulating material 350 that are closer to the nanosheets NS.

Figure 3M:
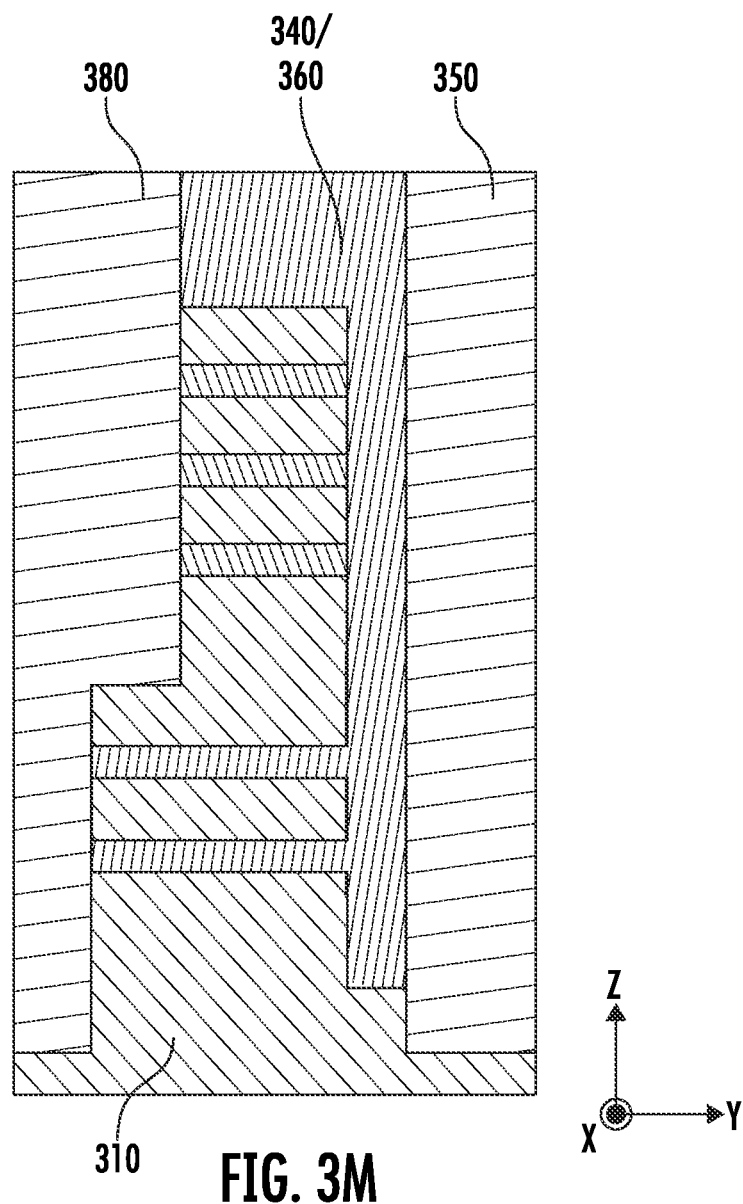
Figure 3N:
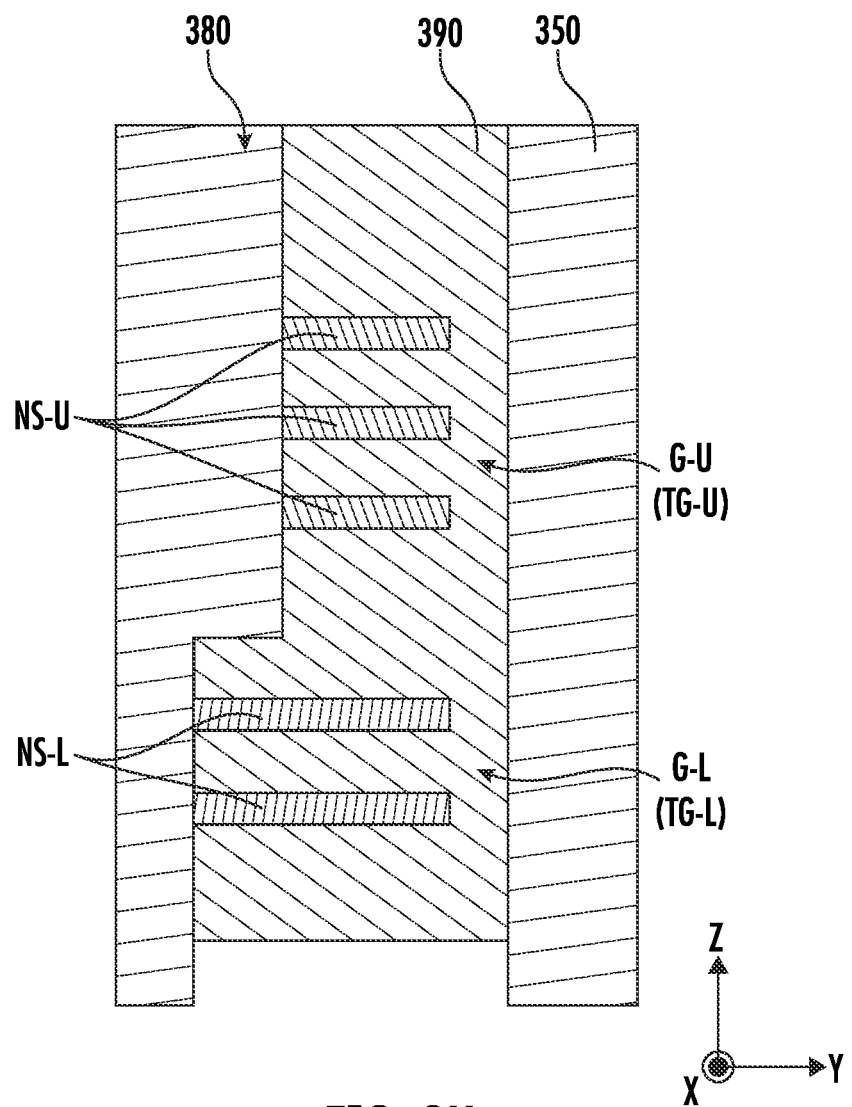

Referring to FIG. 3M, the portion of the spacer 370 that remains after the planarization process is removed and is replaced with a spacer 380. The spacer 380 may comprise the same material as the insulating material 350, and thus may have an etch selectivity with respect to the spacer 340 and the insulating material 360. For example, the spacer 380 may comprise silicon nitride. In some embodiments, the spacer 380 may provide the insulation region 160 that is shown in FIG. 1C.

Referring to FIG. 3N, the sacrificial material 310 (FIG. 3M), the spacer 340 (FIG. 3M), and the insulating material 360 (FIG. 3M) are replaced with a gate electrode material 390, such as a metal. For example, the spacer 340 and the insulating material 360 may be removed and then the sacrificial material 310 may be removed, or vice versa, and resulting openings in the structure may be filled with the gate electrode material 390. As a result, a lower gate G-L of a lower tri-gate transistor TG-L and an upper gate G-U of an upper tri-gate transistor TG-U are formed. The gates G-L, G-U shown in FIG. 3N may thus each be referred to herein as a "tri-gate."

Figure 4:
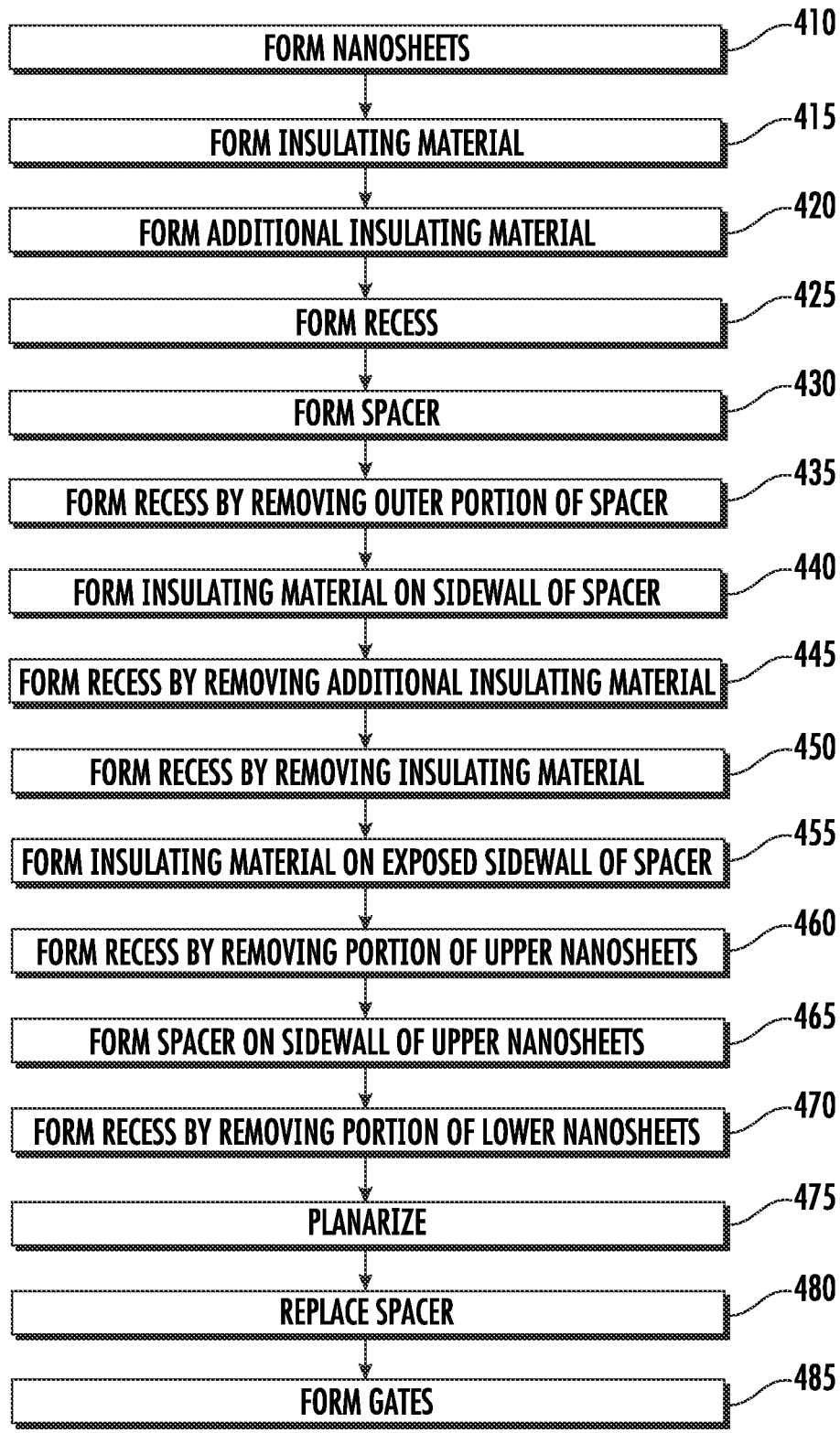
FIG. 4 is a flowchart illustrating operations of forming the nanosheet stack of FIG. 1C.

FIG. 4 is a flowchart illustrating operations of forming the nanosheet stack 120 of FIG. 1C. These operations correspond to those that are shown in the cross-sectional views of FIGS. 3A-3N. The operations include forming (Block 410) vertically-stacked preliminary nanosheets NS-P (FIG. 3A) of a preliminary transistor stack. The preliminary nanosheets NS-P include lower nanosheets and upper nanosheets that are stacked on the lower nanosheets. Moreover, the preliminary transistor stack also includes a sacrificial material 310 (FIG. 3A) that is on the lower nanosheets and the upper nanosheets.

An insulating material 320 (FIG. 3A) is formed (Block 415) on the preliminary transistor stack. Subsequently, an insulating material 330 (FIG. 3B) having an etch selectivity with respect to the insulating material 320 is formed (Block 420) on the insulating material 320. A recess region 301 (FIG. 3C) is then formed (Block 425) by removing an exposed portion of the insulating material 320, along with underlying portions of the preliminary nanosheets NS-P (FIG. 3A) and the sacrificial material 310 (FIG. 3A).

A spacer 340 (FIG. 3D) is formed (Block 430) in the recess region 301. Another recess region 302 (FIG. 3E) is formed (Block 435) by removing an outer (e.g., horizontally-protruding lower) portion of the spacer 340 to expose an upper surface and a sidewall of the sacrificial material 310 (FIG. 3E). Moreover, an insulating material 350 (FIG. 3F) is formed (Block 440) in the recess region 302 and on a sidewall of the spacer 340.

Another recess region 303 (FIG. 3G) is formed (Block 445) by removing the insulating material 330 (FIG. 3B) to expose an upper surface of the insulating material 320 and an upper portion of a sidewall of the spacer 340. Next, the insulating material 320 is removed (Block 450) to form a recess region 304 (FIG. 3H) that exposes an upper surface of the sacrificial material 310 and a middle portion of the sidewall of the spacer 340. An insulating material 360 (FIG. 3H) is then formed (Block 455), such as by deposition thereof, on the exposed sidewall of the spacer 340 and on a portion of the exposed upper surface of the sacrificial material 310.

A further recess region 305 (FIG. 3I) is formed by removing (Block 460) a portion of the sacrificial material 310, as well as portions of the three uppermost nanosheets NS that are thereunder, to narrow a width of three uppermost nanosheets NS. For example, a portion of the preliminary transistor stack that is exposed by the recess region 304 (FIG. 3H) may be etched until reaching a portion of the sacrificial material 310 that is between the three uppermost nanosheets NS and the two lowermost nanosheets NS. A spacer 370 (FIG. 3J) is formed (Block 465) on the insulating material 360 and on exposed sidewalls of the three uppermost nanosheets NS after forming the recess region 305. A recess region 306 (FIG. 3K) is then formed (Block 470) by removing an exposed portion of the upper surface of the sacrificial material 310, along with underlying portions of the two lowermost nanosheets NS.

A planarization process (Block 475) is performed to remove upper portions of the spacer 340, the spacer 370, the insulating material 360, and the insulating material 350. An example result of the planarization process is shown in FIG. 3L. The portion of the spacer 370 that remains after the planarization process is then removed and replaced (Block 480) with a spacer 380 (FIG. 3M) that covers a respective sidewall of each nanosheet NS. Next, lower and upper gates G-L, G-U (FIG. 3N) are formed (Block 485) on the lower and upper nanosheets NS-L, NS-U, respectively, by replacing the sacrificial material 310 (FIG. 3M), the spacer 340 (FIG. 3M), and the insulating material 360 (FIG. 3M) with a gate electrode material 390 (FIG. 3N).

In some embodiments, the threshold voltage of a tri-gate transistor TG (FIG. 1C) can be modulated (e.g., controlled/adjusted) by supplying oxygen to a gate insulation layer of the tri-gate transistor TG. For example, the tri-gate transistor TG may include a gate insulation layer 270 (FIG. 2B), and oxygen may be supplied to the gate insulation layer 270 (i) by thermal diffusion from an insulation region 160 (FIG. 1C) or (ii) by plasma treatment.

As an example, the insulation region 160 may include oxygen and may physically contact the gate insulation layer 270. In some embodiments, the insulation region 160 may be a multi-layer region comprising a first layer that includes oxygen and a second layer that is between the oxygen-containing first layer and the gate insulation layer 270. Oxygen may diffuse to the gate insulation layer 270 through that second layer. Moreover, the insulation region 160 may be referred to herein as "oxygen-rich" when it is configured to supply oxygen to the gate insulation layer 270 through diffusion (e.g., thermal diffusion). Oxygen may, according to some embodiments, diffuse to the gate insulation layer 270 during subsequent process(es) (e.g., an annealing process and/or a thin film deposition process) performed at a high temperature (e.g., 500° C.~1500° C.).

An oxygen-rich insulation region 160 can serve as an oxygen reservoir that compensates for oxygen vacancies in the gate insulation layer 270. For example, the gate insulation layer 270 may comprise hafnium oxide (or another high-k layer) that has imperfect bonding between hafnium and oxygen atoms, where each missing oxygen atom provides an oxygen vacancy that may have a positive charge. An oxygen atom from the oxygen-rich insulation region 160 can thus compensate for the oxygen vacancy and thereby change the positive charge (e.g., to a negative charge).

Additionally or alternatively, the gate insulation layer 270 may be treated with plasma to reduce oxygen vacancies in the gate insulation layer 270. For example, the gate insulation layer 270 may comprise hafnium oxide (or another high-k layer), and treating a side surface of the gate insulation layer 270 with fluorine-based (e.g., fluorine and oxygen) plasma may saturate electrons of hafnium dangling bonds at oxygen vacancy sites, thereby removing/reducing oxygen vacancies in the gate insulation layer 270.

Supplying oxygen to the gate insulation layer 270 can change the threshold voltage of the tri-gate transistor TG by changing charges (e.g., from positive to negative) in the gate insulation layer 270. For example, supplying oxygen to the gate insulation layer 270 can decrease the threshold voltage of a P-type FET ("PFET") tri-gate transistor TG or increase the threshold voltage of an N-type FET ("NFET") tri-gate transistor TG. In some embodiments, the amount of threshold voltage increase or decrease may be up to 300 millivolts. Accordingly, though multi-threshold-voltage integration methods of three-dimensional stacked devices are typically limited due to high aspect ratios, some embodiments of the present invention provide more options for using multiple threshold voltages (e.g., a low threshold voltage and/or a high threshold voltage). Moreover, the tri-gate transistor TG having the threshold voltage that is increased or decreased by oxygen may be either an upper tri-gate transistor TG-U (FIG. 1C) or a lower tri-gate transistor TG-L (FIG. 1C). As an example, some of the transistors in a device that has an oxygen reservoir may not be tri-gate transistors and/or may not have an oxygen reservoir.

Moreover, the gate insulation layer 270 may be a high-k layer. As used herein, the term "high-k" refers to a material that has a higher dielectric constant than silicon dioxide. For example, the gate insulation layer 270 may have a higher dielectric constant than the insulation region 160.

FIGS. 5A-5D are cross-sectional views of different multi-layer examples of a portion of the insulation region 160 of FIG. 1C that is on a tri-gate transistor TG (FIG. 1C). For example, the multi-layer examples shown in FIGS. 5A-5D may be on a sidewall S2 (FIG. 1C) of a lower tri-gate transistor TG-L (FIG. 1C) or a sidewall S4 (FIG. 1C) of an upper tri-gate transistor TG-U (FIG. 1C). In some embodiments, the insulation region 160 (e.g., an oxygen reservoir thereof) may be on the sidewall S4 of the upper tri-gate transistor TG-U and may not be on (i.e., may be absent from) the sidewall S2 of the lower tri-gate transistor TG-L, or vice versa. In other embodiments, the insulation region 160 (e.g., an oxygen reservoir thereof) may be on both the sidewall S4 of the upper tri-gate transistor TG-U and the sidewall S2 of the lower tri-gate transistor TG-L, as shown in FIG. 1C.

Figure 5A:
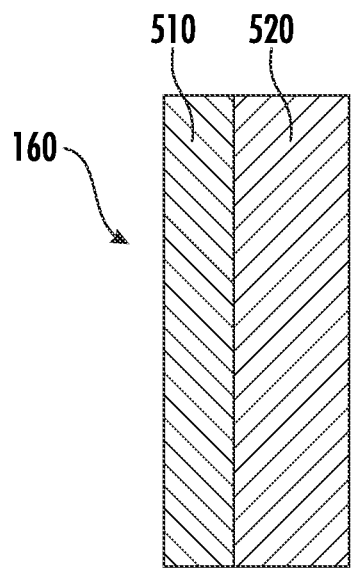
FIGS. 5A-5D are cross-sectional views of different multi-layer examples of a portion of the insulation region of FIG. 1C that is on a tri-gate transistor.

Referring to FIG. 5A, a multi-layer insulation region 160 may include a low-k insulation layer 510 and an oxygen-rich insulation layer 520. The oxygen-rich insulation layer 520 may comprise, for example, silicon oxide, silicon oxycarbide, or silicon oxynitride. In some embodiments, the oxygen-rich insulation layer 520 may be between the low-k insulation layer 510 and a sidewall (e.g., the sidewall S2 or the sidewall S4) of the tri-gate transistor TG.

Figure 5B:
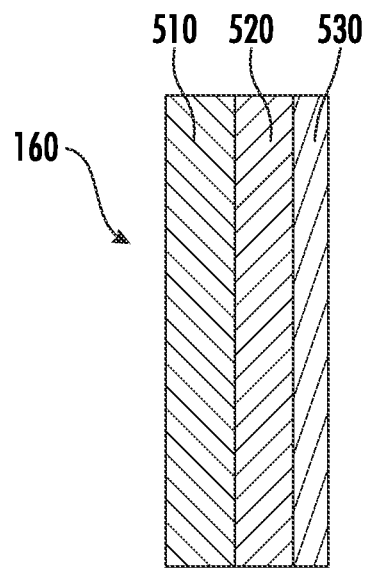

Referring to FIG. 5B, the multi-layer insulation region 160 may include a blocking insulation layer 530 that is between the oxygen-rich insulation layer 520 and the sidewall of the tri-gate transistor TG. Moreover, the blocking insulation layer 530 may be thinner than each of the low-k insulation layer 510 and the oxygen-rich insulation layer 520. For example, the blocking insulation layer 530 may have a thickness of 1-10 nanometers. Accordingly, oxygen atoms can diffuse from the oxygen-rich insulation layer 520 through the blocking insulation layer 530 into the tri-gate transistor TG (e.g., into a high-k gate insulation layer thereof). The blocking insulation layer 530 may comprise, for example, nitride, such as a silicon nitride layer.

In some embodiments, a process of forming the multi-layer insulation region 160 may include forming the blocking insulation layer 530 on the sidewall of the tri-gate transistor TG before forming the oxygen-rich insulation layer 520 on the sidewall of the tri-gate transistor TG. The blocking insulation layer 530 may protect the oxygen-rich insulation layer 520 from a wet chemical (e.g., hydrogen fluoride) that may be used in a process of forming a gate insulation layer 270, which may have a portion 270P (FIG. 8F) that extends between the multi-layer insulation region 160 and a gate G (FIG. 8F) of the tri-gate transistor TG. Moreover, the blocking insulation layer 530 can control modulation of a threshold voltage of the tri-gate transistor TG by controlling the amount of oxygen that diffuses into the gate insulation layer 270.

Figure 5C:
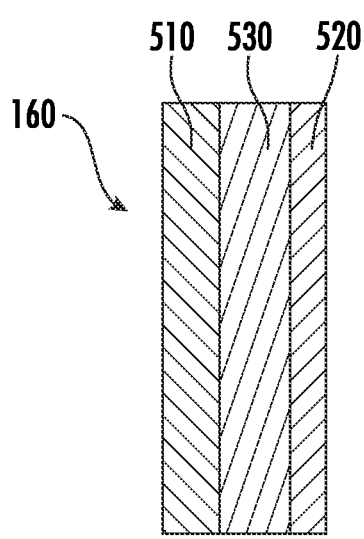

Referring to FIG. 5C, the blocking insulation layer 530 of the multi-layer insulation region 160 may be between the oxygen-rich insulation layer 520 and the low-k insulation layer 510. The oxygen-rich insulation layer 520 can thus be between the blocking insulation layer 530 and the sidewall of the tri-gate transistor TG. Moreover, the oxygen-rich insulation layer 520 may be thinner than each of the low-k insulation layer 510 and the blocking insulation layer 530.

Figure 5D:
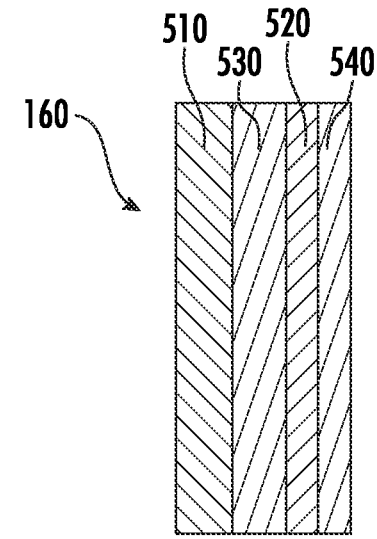

Referring to FIG. 5D, the multi-layer insulation region 160 may include an additional blocking insulation layer 540. For example, the oxygen-rich insulation layer 520 may be between the blocking insulation layers 530, 540. In some embodiments, the blocking insulation layer 540 may be thinner than the blocking insulation layer 530 and may be between the oxygen-rich insulation layer 520 and the sidewall of the tri-gate transistor TG. Moreover, the blocking insulation layers 530, 540 may comprise the same material, such as silicon nitride.

Figure 6A:
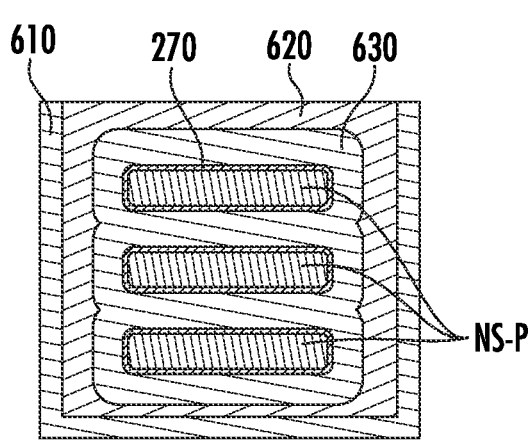
FIGS. 6A-6D are cross-sectional views illustrating operations of forming the insulation region of FIG. 1C after forming a metal gate material.

FIGS. 6A-6D are cross-sectional views illustrating operations of forming the insulation region 160 of FIG. 1C after forming a metal gate material. As shown in FIG. 6A, a plurality of metal gate materials 620, 630 may, in some embodiments, surround vertically-stacked preliminary nanosheets NS-P. For example, the metal gate material 630 may be a work-function metal that is between the metal gate material 620 and the nanosheets NS-P. As an example, the metal gate material 630 may include an N-type work function layer (e.g., a titanium carbide layer, a titanium aluminide layer and/or a titanium aluminum carbide layer) or a P-type work function layer (e.g., titanium nitride layer). The metal gate material 620 may include, for example, tungsten, aluminum, copper, and/or titanium nitride. Moreover, a gate insulation layer 270 may be between the metal gate material 630 and the nanosheets NS-P. For example, each nanosheet NS-P may be surrounded by a respective gate insulation layer 270.

In some embodiments, the metal gate materials 620, 630 may comprise different materials and may be formed between opposing sidewalls of an insulating material 610. As an example, the nanosheets NS-P may be between the opposing sidewalls of the insulating material 610, and the metal gate materials 620, 630 may be formed on the nanosheets NS-P. A planarization process (e.g., chemical mechanical planarization) may be performed to remove upper portions of the metal gate materials 620, 630 (and, in some embodiments, upper portions of the insulating material 610). An example result of the planarization process is shown in FIG. 6A.

Figure 6B:
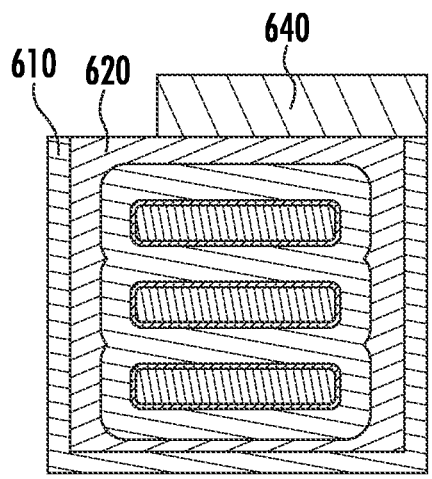

Referring to FIG. 6B, an etch mask 640 may be formed on top of the metal gate materials 620, 630 and the insulating material 610. For example, the etch mask 640 may be formed by depositing and patterning a hard mask material such that it exposes (i) a sidewall and upper surface of the insulating material 610 and (ii) portions of the metal gate materials 620, 630 that are on end portions of the nanosheets NS-P, respectively, that are adjacent the sidewall. The etch mask 640 may comprise, for example, silicon nitride, polysilicon, silicon oxide, silicon oxycarbide, an optical planarization layer, a spin-on hard mask, and/or a photoresist layer.

Figure 6C:
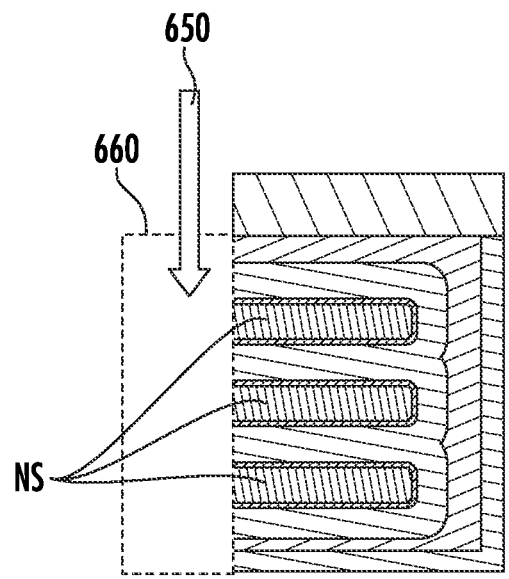

As shown in FIG. 6C, an etching operation 650, such as a dry etch, is performed to cut an edge (e.g., end portion) of each nanosheet NS-P, and remove the exposed sidewall and upper surface of the insulating material 610 and the exposed portions of the metal gate materials 620, 630. During the etching operation 650, the etch mask 640 protects underlying portions of the metal gate materials 620, 630 and the insulating material 610 that are not exposed by the etch mask 640. First portions of the metal gate materials 620, 630, the insulating material 610, and the nanosheets NS-P that are removed by the etching operation 650 are indicated by the etched-out region 660.

Figure 6D:
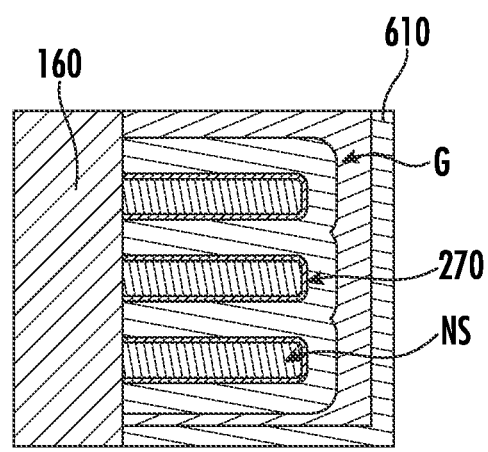

Referring to FIG. 6D, the etching operation 650 of FIG. 6C results in the nanosheets NS and the gate G, which may be a metal gate electrode that includes the metal gate material 620 and/or the metal gate material 630 (FIG. 6A).

FIG. 6D shows that an insulation region 160 is formed in the etched-out region 660 (FIG. 6C) on second portions of the nanosheets NS that are exposed by the etching operation 650. For example, the insulation region 160 may physically contact a sidewall of at least one of (e.g., each of) the nanosheets NS. Moreover, the insulation region 160 may physically contact (i) a sidewall of the gate G and (ii) a portion (e.g., a side surface) of a gate insulation layer 270 that are exposed by the etching operation 650.

The gate insulation layer 270 may be between a nanosheet NS and the gate G. The gate insulation layer 270 may include an interfacial layer (e.g., a silicon oxide layer) and/or a high-k dielectric layer including a high-k material (e.g., hafnium silicate, zirconium silicate, hafnium dioxide and/or zirconium dioxide). For example, the gate insulation layer 270 may include both an interfacial layer and a high-k dielectric layer. Moreover, each nanosheet NS may have a respective gate insulation layer 270 thereon, and the insulation region 160 (e.g., a sidewall thereof) may physically contact each of the gate insulation layers 270.

In some embodiments, formation of the insulation region 160 may include forming an oxygen-rich insulating material in the etched-out region 660 and then performing a planarization process (e.g., chemical mechanical planarization) to remove an upper portion of the oxygen-rich insulating material. An example result of the planarization process is shown in FIG. 6D. The remaining oxygen-rich insulating material of the insulation region 160 can act as an oxygen reservoir that supplies oxygen atoms to the gate insulation layer 270.

Figure 7:
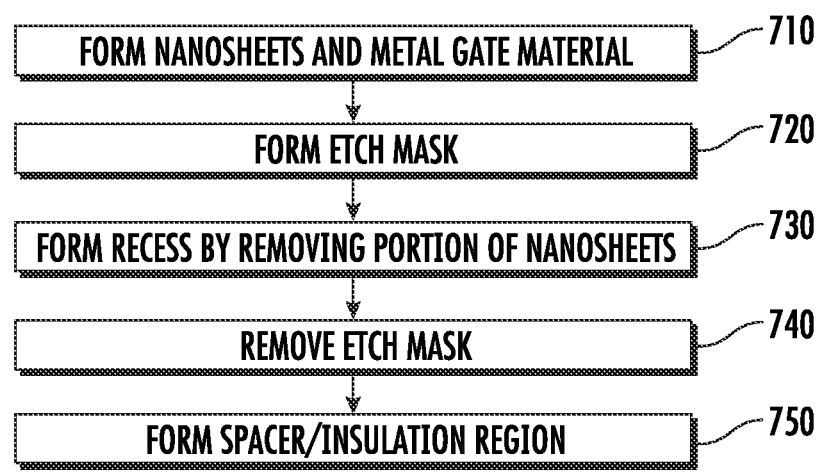
FIG. 7 is a flowchart corresponding to the operations of FIG. 6A-6D.

FIG. 7 is a flowchart corresponding to the operations of FIG. 6A-6D. Referring to FIGS. 6A and 7, the operations include forming (Block 710) preliminary nanosheets NS-P, as well as one or more metal gate materials, such as the metal gate materials 620, 630. As shown in FIGS. 6B and 7, the operations include forming (Block 720) an etch mask 640 on the nanosheets NS-P and metal gate material(s).

Referring to FIGS. 6C and 7, the operations include forming (Block 730) an etched-out region 660 by removing an end portion of each of the nanosheets NS-P, thereby providing the nanosheets NS that each have an exposed sidewall. In some embodiments, the structure that is shown in FIG. 6C may be a portion of a larger stack structure (e.g., may be an upper or lower transistor in a transistor stack), and the etched-out region 660 may be a recess in the stack structure. Moreover, the etch mask 640 may be removed (Block 740) after forming the etched-out region 660.

As shown in FIGS. 6C, 6D, and 7, the insulation region 160 is formed (Block 750) in the etched-out region 660. According to some embodiments, the insulation region 160 may comprise an insulating spacer, such as a spacer 370 (FIG. 3L) or a spacer 380 (FIG. 3M). Moreover, the insulation region 160 may comprise oxygen. By supplying an oxygen atom to the gate insulation layer 270, the insulation region 160 can fill an oxygen vacancy (and thus change the charge thereof) in the gate insulation layer 270 and can thereby modulate a transistor threshold voltage.

FIGS. 8A-8F are cross-sectional views illustrating operations of forming the insulation region 160 of FIG. 1C before forming a metal gate material. Moreover FIGS. 9A and 9B are flowcharts corresponding to the operations of FIG. 8A-8F.

Figure 9A:
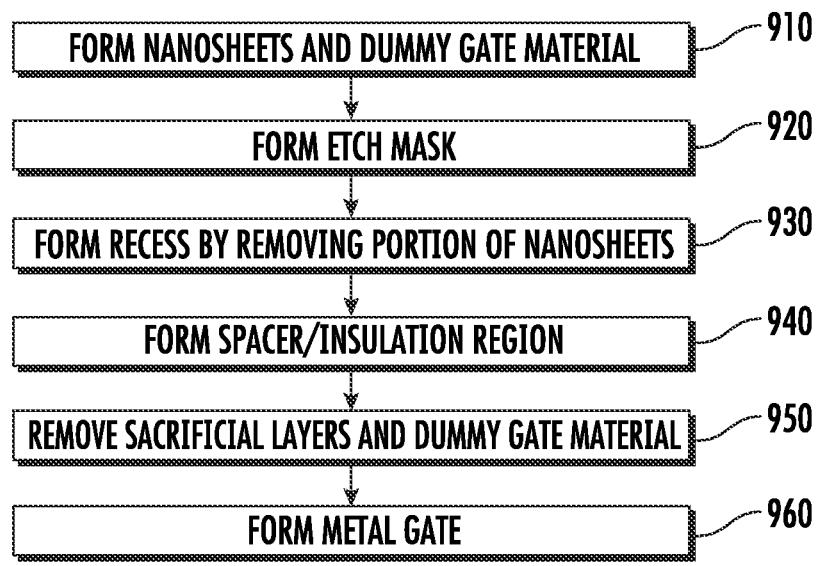
FIGS. 9A and 9B are flowcharts corresponding to the operations of FIG. 8A-8F.
Figure 9B:
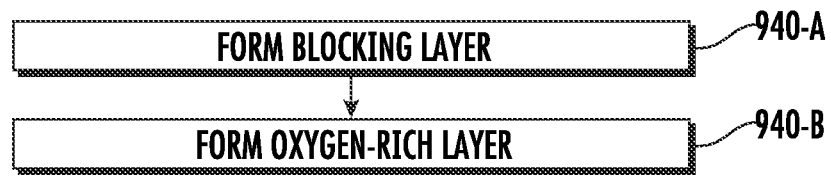

As shown in FIGS. 8A and 9A, the operations include forming (Block 910) a dummy gate material 810 and preliminary nanosheets NS-P. For example, the dummy gate material 810 may comprise polysilicon. Moreover, the nanosheets NS-P may be alternatingly stacked with sacrificial (e.g., polysilicon) layers 820.

Referring to FIGS. 8B and 9A, the operations include forming (Block 920) an etch mask 830. The etch mask 830 may be formed using the same process and/or material(s) that are discussed herein with respect to the etch mask 640 (FIG. 6B). Rather than exposing the metal gate materials 620, 630 (FIG. 6A), however, the etch mask 830 exposes a portion of the dummy gate material 810 that is on an end portion of the stack of nanosheets NS-P.

As shown in FIGS. 8C and 9A, the operations include forming (Block 930) an etched-out region 850 (e.g., a recess) by performing an etching operation 840 that removes an end portion of each of the nanosheets NS-P, thereby providing nanosheets NS that each have an exposed sidewall. The etching operation 840 also removes the portion of the dummy gate material 810 that was on the end portion of the stack of nanosheets NS-P and removes a corresponding end portion of each of the sacrificial layers 820.

Referring to FIGS. 8D and 9A, the insulation region 160 is formed (Block 940) in the etched-out region 840. The insulation region 160 may physically contact exposed sidewalls of the nanosheets NS and the sacrificial layers 820. The insulation region 160 may be formed using the material(s) and/or planarization process that are discussed herein with respect to forming the insulation region 160 in FIG. 6D. Moreover, the insulation region 160 may comprise a spacer, as described herein with respect to FIG. 6D.

As shown in FIGS. 8E and 9A, the operations include removing (Block 950) the sacrificial layers 820 and the dummy gate material 810. In some embodiments, source/drain regions 150 (FIG. 1A) may be formed adjacent the nanosheets NS after forming the insulation region 160 and before removing the sacrificial layers 820 and the dummy gate material 810.

As shown in FIGS. 8F and 9A, the operations include forming (Block 960) a metal gate G, which may include the metal gate material 620 and/or the metal gate material 630 of FIG. 6A. The operations thus comprise a replacement metal gate process. Moreover, gate insulation layers 270 may be formed between the metal gate G and the nanosheets NS. In some embodiments, formation of a gate insulation layer 270 may include forming one or more vertically-protruding portions 270P of the gate insulation layer 270 between the metal gate G and the insulation region 160.

Referring to FIG. 9B, the insulation region 160 may be a multi-layer insulation region. For example, as shown in FIGS. 5B, 8C, 8D, 8F, and 9B, formation of the multi-layer insulation region 160 may include forming (Block 940-A) a blocking insulation layer 530 on exposed sidewalls of the nanosheets NS and sacrificial layers 820. As an example, the blocking insulation layer 530 may physically contact the sidewalls of the nanosheets NS and sacrificial layers 820. After forming the blocking insulation layer 530, formation of the multi-layer insulation region 160 may further include forming (Block 940-B) an oxygen-rich insulation layer 520 (FIG. 5B) on a sidewall of the blocking insulation layer 530. As a result, the blocking insulation layer 530 may be between the oxygen-rich insulation layer 520 and the nanosheets NS.

Figure 10A:
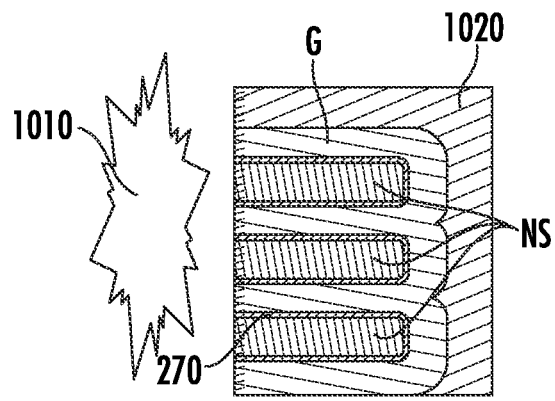
FIGS. 10A-10C are cross-sectional views illustrating operations of forming the insulation region of FIG. 1C on plasma-treated surfaces.
Figure 10B:
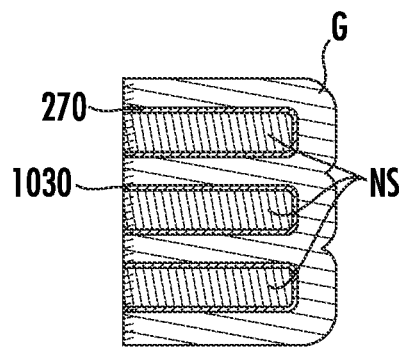
Figure 10C:
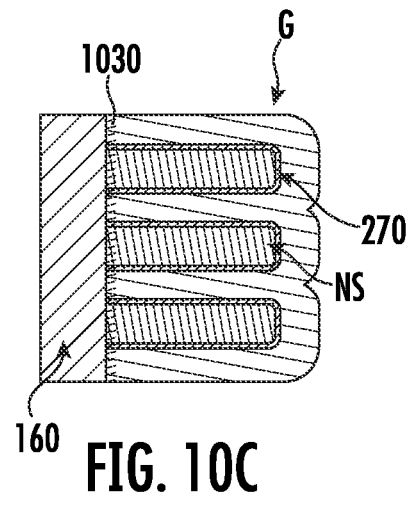
Figure 11:
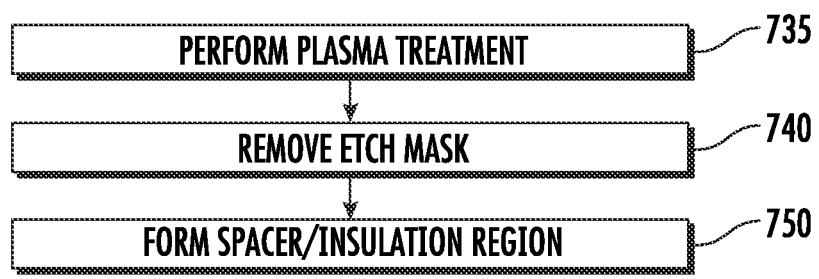
FIG. 11 is a flowchart corresponding to the operations of FIG. 10A-10C.

FIGS. 10A-10C are cross-sectional views illustrating operations of forming the insulation region 160 of FIG. 1C on plasma-treated surfaces. Moreover, FIG. 11 is a flowchart corresponding to the operations of FIG. 10A-10C. As shown in FIGS. 10A and 11, a plasma-treatment operation 1010 may be performed (Block 735) on exposed sidewalls of nanosheets NS and exposed portions of the gate insulation layers 270. In some embodiments, the plasma treatment 1010 may be performed while an etch mask 1020 is on top and side portions of the gate G that were not removed by the etching operation 650 (FIG. 6C). Accordingly, the plasma treatment 1010 may be performed before removing the etch mask 1020 or the etch mask 640 (FIG. 6B), which may be used interchangeably with the etch mask 1020.

The plasma treatment 1010 may use a fluorine-and/or-oxygen-based plasma to passivate (e.g., fill) oxygen vacancies in the gate insulation layers 270. For example, the gate insulation layers 270 may include hafnium oxide (or another high-k layer), and fluorine can passivate the vacancies by saturating the electron of hafnium dangling bonds at the oxygen vacancy sites, thereby neutralizing defects. When a gate insulation layer 270 is a high-k layer, the oxygen vacancies may be positively charged. Neutralizing the oxygen vacancies can thus result in a lower (in terms of absolute value) PFET threshold voltage or a higher NFET threshold voltage.

Referring to FIGS. 10B and 11, the etch mask 1020 (or the etch mask 640) is removed (Block 740). Moreover, FIG. 10B illustrates a plasma-treated region 1030 that results from the plasma treatment 1010. As shown in FIG. 10B, the plasma-treated region 1030 may include sidewalls of the nanosheets NS, as well as a sidewall of the gate G and end portions of the gate insulation layers 270. The plasma-treated region 1030 may comprise, for example, fluorine and/or oxygen when the plasma treatment 1010 uses a fluorine-and/or-oxygen-based plasma. As an example, the plasma treatment 1010 may introduce fluorine into end portions of the gate insulation layers 270.

As shown in FIGS. 10C and 11, the insulation region 160 is formed (Block 750) on the plasma-treated region 1030. For example, a sidewall of the insulation region 160 may be on (e.g., may physically contact) sidewalls of the nanosheets NS, a sidewall of the gate G, and end portions of the gate insulation layers 270. Instead of an oxygen-rich material, the insulation region 160 may alternatively comprise a low-k insulating material to reduce capacitance between the gate G and a drain contact (e.g., a contact 140 (FIG. 1A)). For simplicity of illustration, the insulating material 610 and metal gate material 620 shown in FIG. 6A are omitted from view. In some embodiments, however, the insulating material 610 and metal gate material 620 may be present while performing the plasma treatment 1010. For further simplicity of illustration, Blocks 710-730 of FIG. 7, the operations of which precede those of Blocks 735-750 of FIG. 11, are omitted from view in FIG. 11.

Figure 12:
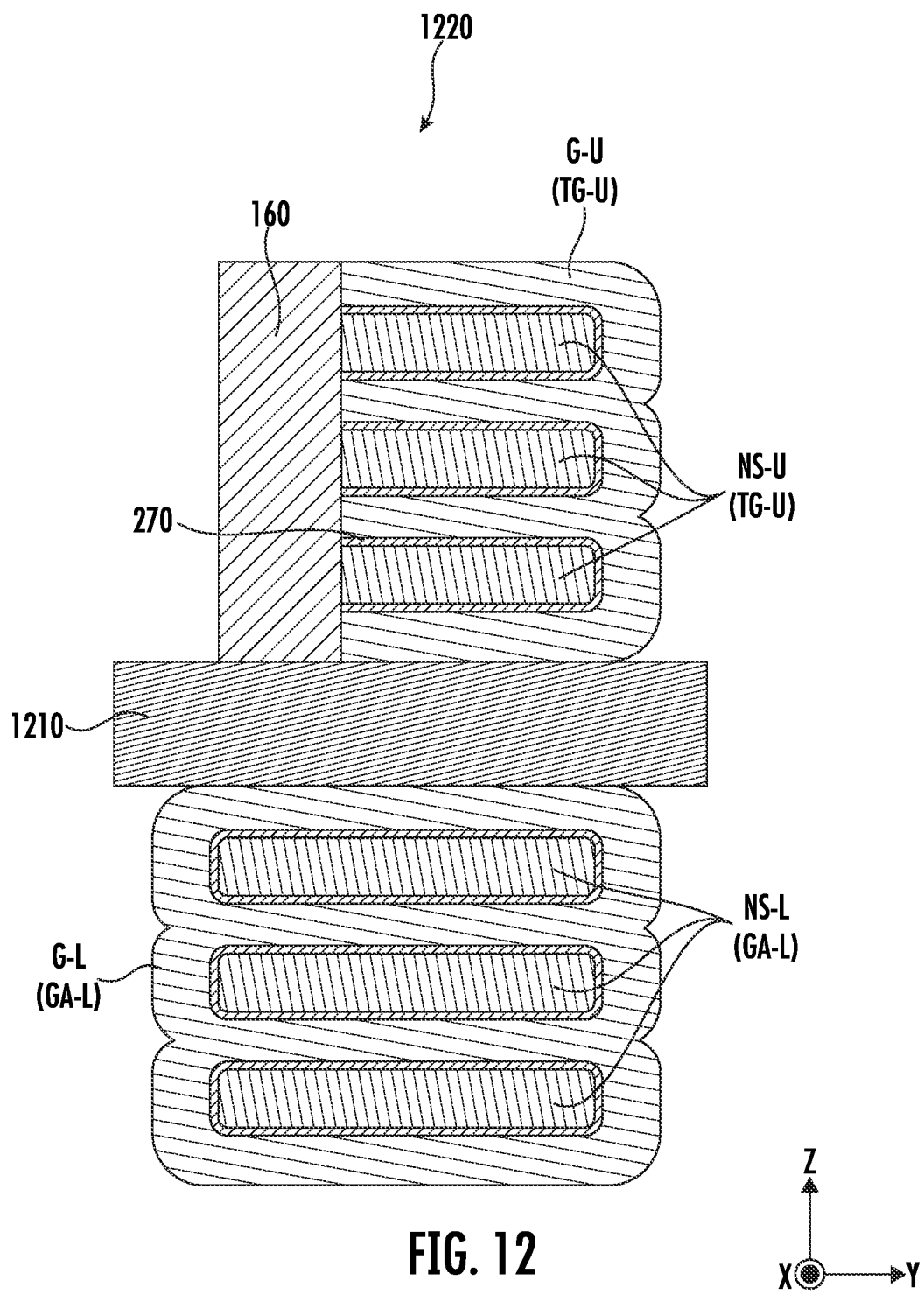
FIG. 12 is a cross-sectional view, taken along the direction Y, of a nanosheet stack according to further embodiments of the present invention.

FIG. 12 is a cross-sectional view, taken along the direction Y (e.g., perpendicular to a channel direction), of a nanosheet stack 1220 according to further embodiments of the present invention. The stack 1220 is provided to illustrate that an insulation layer 1210 may be between an upper tri-gate transistor TG-U and a lower transistor GA-L. Accordingly, the insulation layer 1210 may separate the upper tri-gate transistor TG-U from the lower transistor GA-L. Because upper and lower gate electrodes G-U, G-L are not directly connected to each other when the insulation layer 1210 is therebetween, the gate electrodes G-U, G-L may be controlled separately from one another. Though FIG. 12 illustrates an example embodiment in which the lower transistor GA-L is a GAA transistor, the lower transistor may be a tri-gate transistor TG-L (FIG. 1C) in other embodiments. Moreover, the insulation region 160 may contact a sidewall of the lower tri-gate transistor TG-L instead of the upper tri-gate transistor TG-U in some embodiments.

Nanosheet transistor devices 100, 200 (FIGS. 1A and 2A) according to embodiments of the present invention may provide a number of advantages. These advantages include reducing parasitic capacitance between a gate G (FIGS. 1C and 2B) and a source/drain contact 140 (FIGS. 1A and 2A). Parasitic capacitance can be reduced by decreasing the amount of gate electrode material that is adjacent the source/drain contact 140 and/or by aligning (in the direction X; FIG. 1A) an insulation region 160, 260 (FIGS. 1C and 2A), which may comprise a low-k spacer rather than the gate electrode material, with the source/drain contact 140. For example, the amount of gate electrode material may be reduced by using at least one tri-gate transistor TG (FIGS. 1C-1F) in place of a GAA transistor in a transistor stack 110 (FIG. 1A). As a result, a transistor stack (e.g., a CFET stack) with an sNS structure may have different gate widths WG-L, WG-U (FIG. 1C).

Moreover, the reduced parasitic capacitance can improve alternating current ("AC") speed/performance of the devices 100, 200. For example, by reducing a drain-side capacitance, AC speed/performance can be boosted, such as by boosting the frequency of a logic circuit in one of the devices 100, 200.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present invention are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present invention should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A nanosheet transistor device comprising:
a lower nanosheet transistor having a first nanosheet width;
an upper tri-gate nanosheet transistor on an upper surface of the lower nanosheet transistor and having a second nanosheet width that is narrower than the first nanosheet width; and
an insulation region that comprises oxygen and is on the upper surface of the lower nanosheet transistor and a sidewall of the upper tri-gate nanosheet transistor.

2. The nanosheet transistor device of claim 1,
wherein the lower nanosheet transistor comprises a lower gate that is wider than an upper gate of the upper tri-gate nanosheet transistor,
wherein the sidewall of the upper tri-gate nanosheet transistor comprises a sidewall of the upper gate, and
wherein the insulation region contacts the sidewall of the upper gate.

3. The nanosheet transistor device of claim 1,
wherein the lower nanosheet transistor further comprises a plurality of lower nanosheets,
wherein the upper tri-gate nanosheet transistor further comprises a plurality of upper nanosheets that overlap the plurality of lower nanosheets, and
wherein the insulation region contacts at least one of the plurality of upper nanosheets.

4. The nanosheet transistor device of claim 1,
wherein the lower nanosheet transistor is a tri-gate nanosheet transistor or a gate-all-around (GAA) nanosheet transistor,
wherein the upper tri-gate nanosheet transistor comprises a gate insulation layer, and
wherein the insulation region contacts the gate insulation layer.

5. The nanosheet transistor device of claim 1, wherein the insulation region comprises a multi-layer spacer comprising:
a first layer comprising the oxygen; and
a second layer that is between the first layer and the sidewall of the upper tri-gate nanosheet transistor.

6. The nanosheet transistor device of claim 5, wherein the second layer is a blocking layer that comprises nitride.

7. A nanosheet transistor device comprising:
a transistor stack comprising:
a lower nanosheet transistor comprising a plurality of lower nanosheets, the lower nanosheet transistor having a first nanosheet width and a lower gate width;
an upper nanosheet transistor comprising a plurality of upper nanosheets on the lower nanosheet transistor, the upper nanosheet transistor having a second nanosheet width and an upper gate width that are different from the first nanosheet width and the lower gate width, respectively; and
an insulation region comprising a sidewall that contacts at least one of the plurality of lower nanosheets and is on a sidewall of a gate of the lower nanosheet transistor, or contacts at least one of the plurality of upper nanosheets and is on a sidewall of a gate of the upper nanosheet transistor,
wherein the lower nanosheet transistor or the upper nanosheet transistor further comprises a gate insulation layer comprising an end portion that is on the sidewall of the insulation region.

8. The nanosheet transistor device of claim 7, wherein the insulation region is on the sidewall of the gate of the lower nanosheet transistor and is configured to modulate a threshold voltage of the lower nanosheet transistor.

9. The nanosheet transistor device of claim 7, wherein the insulation region is on the sidewall of the gate of the upper nanosheet transistor and is configured to modulate a threshold voltage of the upper nanosheet transistor.

10. The nanosheet transistor device of claim 7, wherein the insulation region comprises a spacer that comprises oxygen and has a lower dielectric constant than the gate insulation layer.

11. The nanosheet transistor device of claim 7, wherein the lower nanosheet transistor and the upper nanosheet transistor are a gate-all-around (GAA) nanosheet transistor and a tri-gate nanosheet transistor, respectively, or vice versa, or are respective tri-gate nanosheet transistors.

12. The nanosheet transistor device of claim 7, wherein the gate of the lower nanosheet transistor contacts the gate of the upper nanosheet transistor.

13. The nanosheet transistor device of claim 7, further comprising an insulation layer that separates the gate of the lower nanosheet transistor from the gate of the upper nanosheet transistor.

14. The nanosheet transistor device of claim 7,
wherein the sidewall of the insulation region contacts the end portion of the gate insulation layer, and
wherein the gate insulation layer has a higher dielectric constant than the insulation region.

15. The nanosheet transistor device of claim 14, wherein the end portion of the gate insulation layer comprises fluorine.

16. A nanosheet transistor device comprising:
a lower nanosheet transistor having a first nanosheet width;
an upper tri-gate nanosheet transistor on an upper surface of the lower nanosheet transistor and having a second nanosheet width that is narrower than the first nanosheet width; and
an insulation region that comprises oxygen and is on the upper surface of the lower nanosheet transistor and is in contact with a sidewall of the upper tri-gate nanosheet transistor.

17. The nanosheet transistor device of claim 16,
wherein the lower nanosheet transistor is a tri-gate nanosheet transistor or a gate-all-around (GAA) nanosheet transistor,
wherein the upper tri-gate nanosheet transistor comprises a gate insulation layer, and
wherein the insulation region is in contact with the gate insulation layer.

18. The nanosheet transistor device of claim 16, wherein the insulation region comprises a multi-layer spacer comprising:
a first layer comprising the oxygen; and
a second layer that is between the first layer and the sidewall of the upper tri-gate nanosheet transistor.

19. The nanosheet transistor device of claim 18, wherein the second layer is a blocking layer that comprises nitride.

20. The nanosheet transistor device of claim 16, wherein the insulation region is configured to modulate a threshold voltage of the upper tri-gate nanosheet transistor.

* * * * *